United States Patent
Watson

(10) Patent No.: US 9,945,896 B2
(45) Date of Patent: Apr. 17, 2018

(54) ACTIVE MONITORING SYSTEMS FOR HIGH VOLTAGE BUSHINGS AND METHODS RELATED THERETO

(71) Applicant: Joe David Watson, Jupiter, FL (US)

(72) Inventor: Joe David Watson, Jupiter, FL (US)

( * ) Notice: Subject to any disclaimer, the term of this patent is extended or adjusted under 35 U.S.C. 154(b) by 69 days.

(21) Appl. No.: 14/955,901

(22) Filed: Dec. 1, 2015

(65) Prior Publication Data

US 2016/0154051 A1 Jun. 2, 2016

Related U.S. Application Data

(60) Provisional application No. 62/123,860, filed on Dec. 1, 2014.

(51) Int. Cl.
*G01R 31/12* (2006.01)
*G01R 27/26* (2006.01)

(52) U.S. Cl.
CPC ..... *G01R 31/1245* (2013.01); *G01R 27/2617* (2013.01); *G01R 31/1263* (2013.01); *G01R 31/1272* (2013.01); *G01R 27/26* (2013.01); *G01R 31/12* (2013.01)

(58) Field of Classification Search
CPC .... G01R 31/00; G01R 31/12; G01R 31/1227; G01R 31/1245; G01R 31/1263; G01R 31/1272; G01R 27/00; G01R 27/02; G01R 27/26; G01R 27/2617
USPC ................. 324/500, 537, 551, 552
See application file for complete search history.

(56) References Cited

U.S. PATENT DOCUMENTS

| | | | |
|---|---|---|---|
| 6,313,640 B1 | 11/2001 | Nasrallah et al. | |
| 2008/0309351 A1 | 12/2008 | Stewart et al. | |
| 2010/0106435 A1* | 4/2010 | Werelius | G01R 31/027 702/60 |
| 2011/0234243 A1* | 9/2011 | Santos | G01R 31/1227 324/659 |
| 2013/0107410 A1 | 5/2013 | Rolli et al. | |

FOREIGN PATENT DOCUMENTS

WO  WO 2014/114516 A1  7/2014

* cited by examiner

*Primary Examiner* — Hoai-An D Nguyen
(74) *Attorney, Agent, or Firm* — Blank Rome LLP

(57) ABSTRACT

Systems and methods for measuring the integrity of insulation components in electrical systems. In preferred embodiments, an active sensor is coupled to a test tap of a bushing, the active sensor having an electrical circuit electrically coupled to the test tap, and wherein the electrical circuit includes a high pass filter that divides the electrical circuit into a high frequency bus and a power frequency bus. A grounded high frequency voltage is injected into the test tap via the frequency bus circuit. Resulting voltages and currents may be measured and compared to a reference voltage to determine capacitances and power factors for both the inner and outer sections of the bushing. Once the capacitances and power factors of the bushings are known, grounded and ungrounded high frequency voltages may be injected to determine capacitances and power factors of a connected transformer or reactor.

32 Claims, 17 Drawing Sheets

ACTIVE MONITORING SYSTEMS FOR HIGH VOLTAGE BUSHINGS AND METHODS RELATED THERETO

CROSS-REFERENCE TO RELATED APPLICATIONS

This application claims the benefit of U.S. Provisional Application No. 62/123,860 filed on Dec. 1, 2014, which is hereby incorporated by reference in its entirety.

FIELD OF THE INVENTION

The present patent document relates to active monitoring systems for high voltage bushings and methods related thereto. In particular, the present patent document relates to active monitoring systems for transformers, reactors and condenser type bushings and the methods of making and using the same. The embodiments described herein may be used for any bushing equipped with a test tap.

BACKGROUND

In the area of electrical power, a bushing is an insulated device that allows an electrical conductor to pass safely through an (usually) earthed conducting barrier such as the wall of a transformer, circuit breaker or reactor. A condenser bushing is a bushing in which metallic or nonmetallic conducting layers are arranged within the insulating material for the purpose of controlling the distribution of the electric field of the bushing, both axially and radially by capacitive grading. In many cases, bushings may be used with very high voltages such that a failure in the bushing may lead to arcing and a catastrophic failure of the attached device. Accordingly, testing and monitoring of the bushing is very advantageous.

The current solutions for on-line transformer monitoring are passive systems that can only provide bushing capacitance and power factor values for the inner condenser section of energized bushings. The capacitance and power factor values for both the transformer and for the outer condenser section of an energized bushing cannot be measured. The embodiments described herein are a significant improvement in the art that address, or at least ameliorate, some of the shortcomings of the current art.

FIG. 1 illustrates a current design of a bushing monitoring system comprising a condenser-type bushing 10, a passive sensor 20, and a monitor processor 30. High voltage condenser-type bushings 10 may be designed in a wide variety of constructions, and the description herein is not intended to describe all of the possible types of designs. However, the majority of high-voltage condenser-type bushings 10 currently manufactured are constructed with an inner capacitive condenser section 12 referred to as C1, and, an outer capacitive condenser section 14, referred to as C2. These bushing sections C1 and C2 are wound radially around the bushing's central conductor 11. The inner C1 section 12 comprises the bulk of the total condenser 13. The outer C2 section 14 of the condenser 13 normally contains only 5% to 10% of the total number of layers in the complete condenser 13. This type of bushing 10 is normally equipped with an external tap connection 16, which is coupled to a foil layer between the inner C1 section 12 and the outer C2 section 14. The tap 16 may be referred to by several different names such as a test tap, capacitance tap, voltage tap, power factor tap or other designations. For the purposes of this document, we will refer to the tap 16 as a test tap.

The inner C1 section 12 of the bushing condenser 13 provides a capacitive structure, which is intended to provide a consistent voltage stress gradient from the energized inner conductor 11 to the outer layer of the inner C1 section 12. The outer layer of the inner C1 section 12 is normally connected to an earth ground 18 when the bushing 10 is in-service. Grounding of the inner C1 section 12 is normally accomplished by attaching a cover onto the test tap 16. The cover electrically connects the test tap 16 to the grounded metal flange of the bushing.

In many condenser designs, the outer layer of the outer C2 section 14 is also grounded. In such embodiments, the outer layer of the outer C2 section 14 of the bushing 10 may be comprised of a conductive foil which is connected to the grounded metal flange of the bushing 10. When this type of bushing 10 is in-service and the test tap cover is installed, the C2 condenser section 14 is either directly or effectively earth grounded on the inner and outer layers. However, in some bushings, normally in bushings designed for lower voltages, the outer layer may be ungrounded and separated from the grounded metal flange of the bushing 10 by an insulating fluid or dielectric.

Typically, the C1 and C2 bushing condenser sections 12 and 14 have capacitance values in the pico-farad range which result in high impedances and low leakage currents through the condenser 13. Typically, the C1 and C2 condenser sections 12 and 14 also have low power factor values that are normally in the 0.2% to 0.5% range as a result of the low power losses in the condenser 13.

During the normal manufacturing process, the C1 and C2 bushing sections 12 and 14 are tested for capacitance and power factor. This ensures the bushings sections 12 and 14 are manufactured without defects. In addition, field tests can be performed after the bushings are installed to detect deterioration or damage to the condenser 10. If the condenser 10 deteriorates sufficiently, the bushing 13 can fail catastrophically, which can cause consequential equipment damage or unsafe conditions for workers in the area. Often, off-line tests and on-line monitoring are performed with the goal to detect such deterioration before a failure occurs.

Bushings are commonly used with transformers or reactors. The transformer or reactor windings have self and mutual capacitances that represent the quality of the insulation for each winding to the grounded parts of the transformer, or between the different windings inside the transformer. Each winding has a capacitance to ground that is a function of the physical dimensions and clearances of the windings as well as the condition of the insulation. For the high voltage ("HV") winding, this has traditionally been referred to as $C_H$. For the low voltage ("LV") winding, this has traditionally been referred to as $C_L$. And the capacitance between the HV and LV windings has traditionally been referred to as $C_{HL}$. Similar designations can be made for three-winding transformers with HV, LV and tertiary voltage (TV) windings to provide $C_H$, $C_L$, $C_T$, $C_{HL}$, $C_{HT}$ and $C_{LT}$ values.

Off-line tests, when the equipment is not in-service, have been performed on transformers, reactors and bushings for several years. In order to test a condenser-type bushing's inner C1 section 12, the bushing's test tap cover is removed and test voltages are applied to the center conductor 11 and the resulting current magnitude and relative phase angle are measured from the test tap 16. In order to test the outer C2 section 14, the test tap 16 is energized and the resulting current from the grounded metal flange of the bushing is measured for amplitude and relative phase angle. Off-line tests on higher voltage bushings are normally performed at significantly reduced voltage levels since it is not practical to produce the rated bushing voltages with portable field test equipment. Off-line transformer tests are performed at the same reduced test voltage levels with the voltage applied to the top terminals of the bushings and the resulting current magnitude and phase angle shift are measured to calculate capacitance and power factor values for each winding.

On-line bushing monitoring, when the equipment is energized and in-service, has been performed for a shorter time. The current art connects a passive sensor 20 to the test tap 16 and measures the resulting test tap current magnitude and phase angle when the bushing 10 is energized by the power system. As may be seen in FIG. 1, the typical passive sensor 20 included a shunt resistor or capacitor 22 (labelled "A") and a voltage arrestor 24 (labelled "B"). This method only measures the power frequency current 26 (labelled "$I_P$") through the inner C1 section 12 of the condenser 13 so only the C1 capacitance and power factor can be determined. Neither the outer C2 section 14 of the condenser 13 nor the transformer winding capacitances can be monitored with the current method.

Additionally, transformers with wye winding connections may have neutral bushings that are connected to earth ground either directly or through an impedance, to stabilize the three-phase voltages and limit the phase-ground voltages to safe levels. These neutral bushings can be tested with off-line testing equipment, but neither the inner C1 section 12 nor the outer C2 section 14 of the bushing 10 can be monitored on-line with the current art since the center conductor 11 is effectively grounded and no voltage nor current are produced at the test tap 16.

SUMMARY OF THE EMBODIMENTS

In view of the foregoing, an object according to one aspect of the present patent document is to provide a new active monitoring system which allows complete on-line testing. In preferred embodiments, the system will measure and monitor the inner C1 section and outer C2 section capacitances for each energized and neutral bushing as well as the self and mutual capacitances for each transformer or reactor winding. Preferably the methods and apparatuses address, or at least ameliorate one or more of the problems described above. To this end, a system for monitoring insulation components in a power system including a bushing is provided. In one embodiment the system comprises: a 1 kHz or more voltage source in electrical communication with a test tap of the bushing; and, a sensor electrically coupled to the system to measure a current magnitude and a phase angle of a high frequency current produced by the 1 kHz or more voltage passing through the condenser sections of the bushing. The system may be used to monitor phase bushings or neutral bushings.

In preferred embodiments, the system further comprises an active sensor coupled to the test tap, the active sensor comprising an electrical circuit electrically coupled to the test tap, wherein the electrical circuit includes a high pass filter that divides the electrical circuit into a high frequency bus and a power frequency bus.

In some embodiments, the voltage source is 20 kHz or more. In yet other embodiments, the frequency of the voltage source is 50 kHz or more. In still yet other embodiments, frequencies of 60 kHz or more, 100 kHz or more or 150 kHz or more may be used. In still yet other embodiments, frequencies all the way up to 1 Mhz may be used.

In another aspect of the inventions described herein, a method for monitoring insulation components in an energized system including a bushing is provided. In a preferred embodiment, the method comprises: injecting a 1 kHz or more high frequency voltage into a test tap of the bushing; measuring a current magnitude and a phase angle of a high frequency current produced in condenser sections of the bushing by the high frequency voltage; and, determining a capacitance and power factor of the appropriate condenser section of the bushing from the measured current magnitude and phase angle. The method may be used with phase bushings or neutral bushings.

In another embodiment, a system for monitoring insulation components in a power system including a bushing is provided. In some embodiments, the system comprises: an active sensor coupled to a test tap of the bushing, the active sensor comprising an electrical circuit electrically coupled to the test tap, wherein the electrical circuit includes a high pass filter that divides the electrical circuit into a high frequency bus and a power frequency bus, the power frequency bus including a shunt; a high frequency voltage source in electrical communication with the high frequency bus and the test tap via the high pass filter; and a monitor electrically connected to the active sensor to allow a voltage measurement across the shunt and a current measurement on the high frequency bus.

In some embodiments, the system further comprises a first high frequency current transformer coupled to a top of the bushing and a second high frequency current transformer coupled to a bottom of the bushing.

In some embodiments, the power frequency bus is electrically coupled to a body of the active sensor. In some embodiments, the electrical circuit of the active sensor further comprises a resistor electrically connecting the test tap to the sensor body. In some of those embodiments, the resistor has a resistance around 100 kΩ.

In still yet other embodiments, the system further comprises an electric field measuring device in electrical communication with a center conductor on a power grid side of the bushing.

In some embodiments, the system further comprises a reference voltage source in electrical communication with the monitor. In some embodiments, the reference voltage source is a capacitance coupled voltage transformer or a potential transformer in electrical communication with the top of the bushing.

In some embodiments, different high frequency voltages with different frequencies may be injected into the test tap of a bushing. In some embodiments, the high frequency voltage source is designed to supply a voltage at two separate frequencies about 50 kHz apart.

In another aspect of the invention of the present patent document, a method for monitoring insulation components in an energized system is provided. In some embodiments, the method comprises: attaching an active sensor to a bushing test tap, the active sensor including an electrical circuit that has a high pass filter that separates the circuit into a power bus circuit and a frequency bus circuit; injecting a high frequency voltage into the test tap via the frequency bus circuit; measuring a current magnitude and a phase angle of a high frequency current produced in the sensor body by the high frequency voltage; and, determining a capacitance and power factor for an outer condenser section of the bushing from the measured current magnitude and phase angle.

In some embodiments of the method, the method further comprises: measuring a voltage across a shunt in the power bus circuit; determining a first current magnitude and a first phase angle from the voltage across the shunt; and, determining a capacitance and power factor for an inner condenser section of the bushing from the measured first current magnitude and first phase angle.

In some embodiments, the method further comprises measuring a voltage magnitude and phase angle from a reference voltage source and comparing the measured voltage magnitude and phase angle with the first current magnitude and first phase angle to determine the capacitance and power factor for the inner condenser section of the busing. In different embodiments, the reference voltage source may be different. In some embodiments, the reference voltage source is supplied by an electrical field measuring and transmitting device in electrical communication with a center conductor on a power grid side of the bushing. In other embodiments, the reference voltage source is hard wired from a transformer. In other embodiments, the reference voltage source is supplied by a capacitive coupled voltage transformer in electrical communication with a center conductor of a power grid side of the bushing. In still yet other embodiments, the reference voltage source is supplied by a Potential Transformer in electrical communication with a center conductor of a power grid side of the bushing.

In many embodiments, the method further comprises receiving a reference current magnitude and phase angle from a high frequency current transformer in electrical communication with a center conductor of a power grid side of the bushing and using the reference current magnitude and phase angle to determine the capacitance and power factor of the inner condenser section of the bushing.

In typical embodiments, the injected high frequency voltage has a frequency between about 1 kHz and 100 kHz. In other embodiments, other frequencies may be used.

In many embodiments, the monitoring system may monitor aspects of a transformer and/or reactor in addition to the bushing. In some of those embodiments, the high frequency voltage is ungrounded and the method further comprising measuring the voltage at a second test tap of a second bushing that is the result of the injected ungrounded high frequency voltage passing through a transformer or reactor and further comprising calculating the CHL of the transformer or reactor. In methods monitoring transformers and/or reactors, the methods may further comprise calculating the CHL capacitances and power factor values.

Further aspects, objects, desirable features, and advantages of the apparatus and methods disclosed herein will be better understood from the detailed description and drawings that follow in which various embodiments are illustrated by way of example. It is to be expressly understood, however, that the drawings are for the purpose of illustration only and are not intended as a definition of the limits of the claimed invention.

DETAILED DESCRIPTION OF THE EMBODIMENTS

Embodiments of the invention described herein enable on-line tests to be performed on energized bushings, transformers and reactors. These tests may accurately measure bushing impedance, expressed as capacitance and power factor, for both the C1 and C2 sections of the condenser on both phase bushings and neutral bushings. In addition, the embodiments described herein preferably also provide the ability to measure the self and mutual capacitances of each winding.

The embodiments described herein operate by injecting a high frequency voltage into the test tap of a bushing. The resulting high frequency current may then be measured to determine and/or calculate information about the integrity of various insulation components in the system. A high frequency voltage is used because a high frequency voltage may be distinguished from the typical frequency of the transformer, reactor or other system, which is typically around 60 Hz. Using a high frequency signal is also desirable because a high frequency voltage will penetrate the system at low voltage levels. Using low voltage levels is safer, will not affect operation of the system and therefore, may be used while the system is energized, and is easily filtered from the normal power of the system. As used herein high frequency means 1 kHz or more. Depending on the bushing and system its attached to, different frequencies may be used. Generally, the larger the system the higher the frequency. Accordingly, in yet other systems 100 kHz or more or even 150 kHz or more may be used. In still yet other embodiments, system all the way up to 1 MHz may be used.

In preferred embodiments, an improved bushing sensor design is provided and combined with an active test device and additional sensors. In some embodiments, the system may include a high frequency current transformers. In other embodiments, the system may use an electrical field measurement device. Additional embodiments may utilize utility-type current transformers and/or potential transformers connected to the high voltage bus to provide the required inputs with wired connections to the monitoring system. The improved bushing sensor design can measure the power frequency leakage current produced by the system voltage applied to the bushing and can also measure the high frequency leakage current produced by a high frequency voltage applied to the bushing test tap and bushing sensor body. The test device contains the high frequency power supply and control and measurement circuitry for application of the high frequency voltages to the sensor and measurement of the resulting high frequency voltages and leakage currents. In preferred embodiments, the new bushing sensor design also eliminates the risk of unsafe voltages with on-line bushing monitoring systems.

Figure 1:
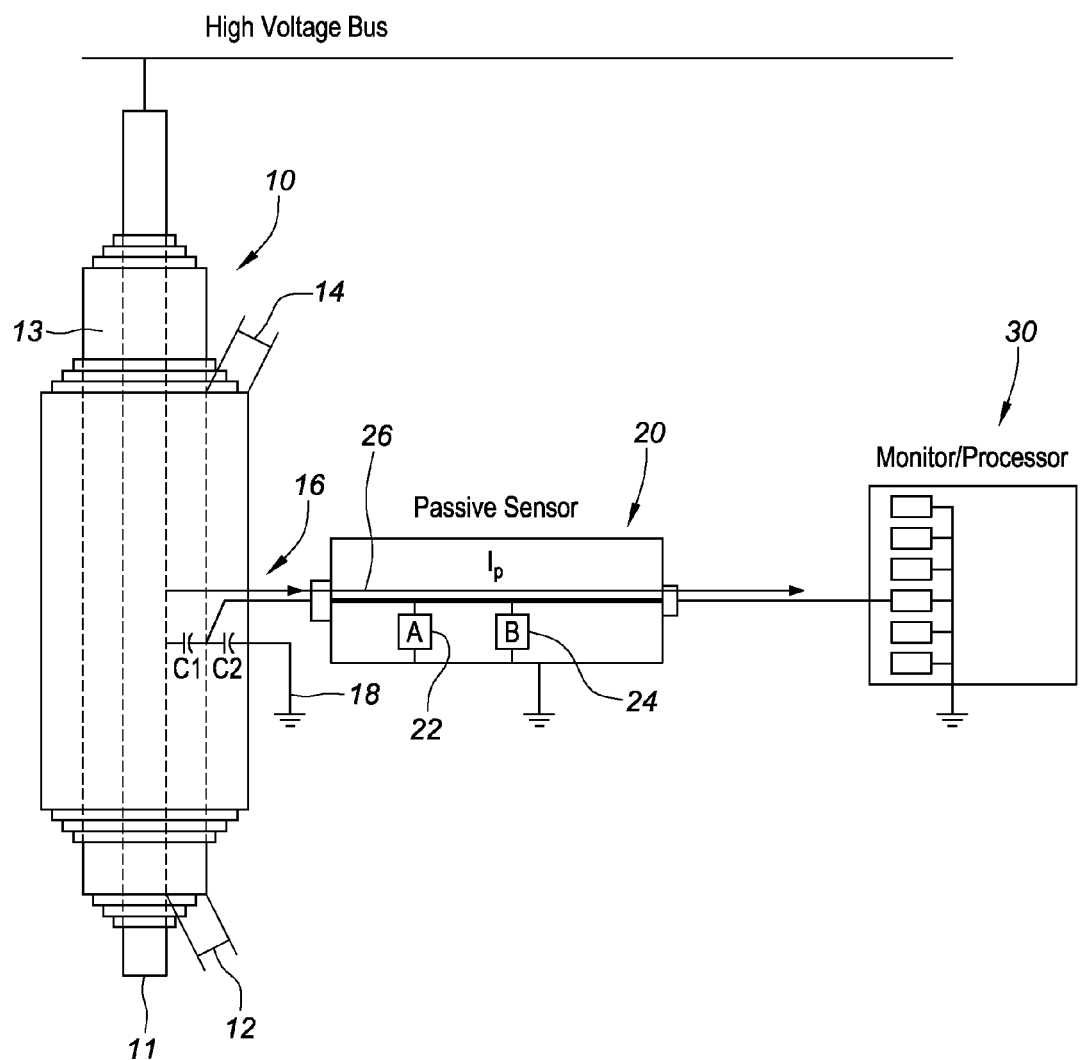
FIG. 1 illustrates a current design of a bushing monitoring system comprising a condenser-type bushing, a passive sensor, and a monitor processor.
Figure 2:
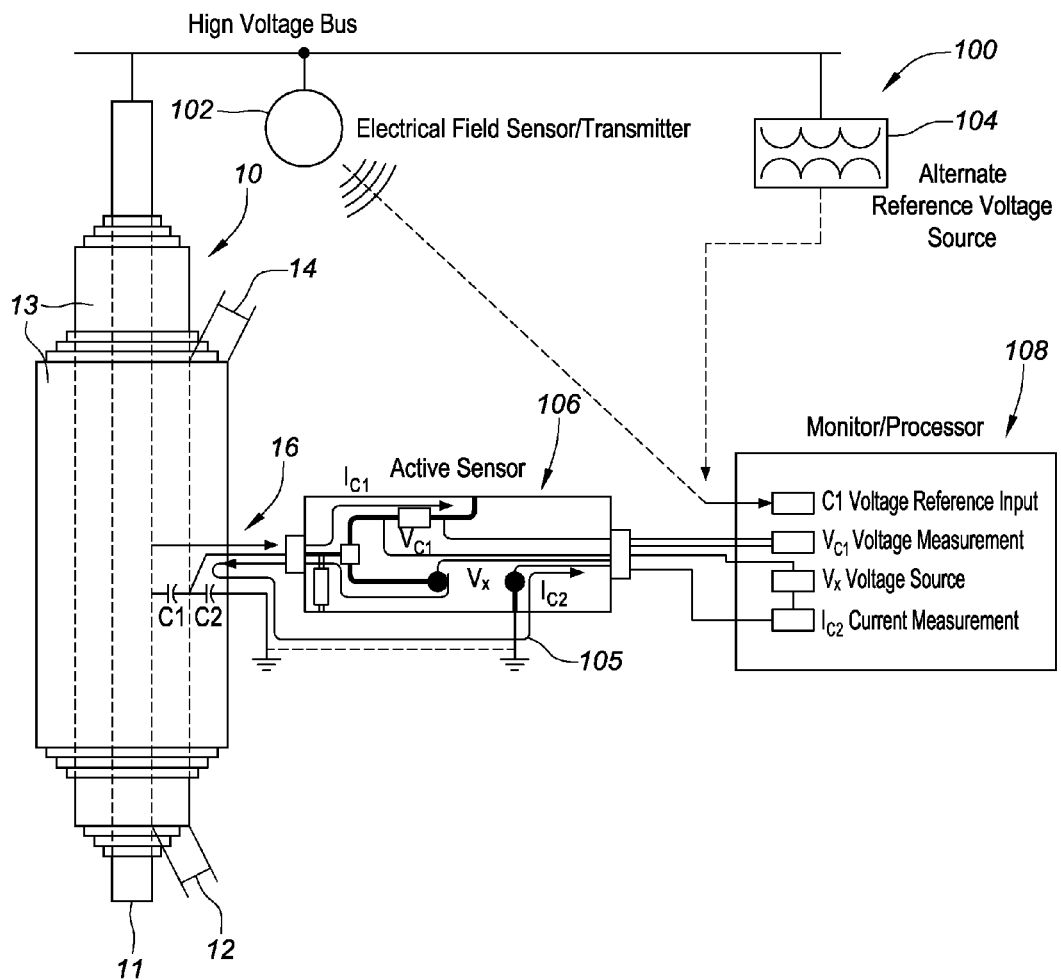
FIG. 2 illustrates one embodiment of a system for actively monitoring a phase bushing.

FIG. 2 illustrates one embodiment of a system 100 for actively monitoring a phase bushing 10. As may be seen in FIG. 2, the system 100 includes an active sensor 106, an electric field sensor 102 and a monitor/processor 108. In alternative embodiments, a reference voltage source 104 may be used to supply the reference voltage instead of the electric field sensor 102. The embodiment illustrated in FIG. 2 is capable of monitoring both the inner C1 section 12 of the bushing 10 and the outer C2 section 14 of the bushing 10 even when the bushing 10 is energized.

In operation, the system 100 not only measures the inner C1 section 12 current magnitude and phase angle, the system 100 also applies a high frequency voltage Vx across the C2 section 14 of the bushing condenser 10 and measures the resulting current magnitude and phase angle through the C2 section 14 of the condenser 13. The inner C1 section 12 current magnitude and phase angle may be measured via a connection between the active sensor 106 and the test tap 16. In order to measure the outer C2 section 14 of the condenser 13, a high frequency voltage Vx is injected at the test tap 16. In preferred embodiments, the high frequency voltage Vx produces a current magnitude in the 5-50 mA range with a voltage in the 10 Volt range. A high frequency voltage Vx is preferred because the impedance of the outer C2 section capacitance is reduced with higher frequency. For example, for a bushing 10 with an outer C2 section capacitance of approximately 500 pico-Farads, 10 Volts at 100 kHz across the outer C2 section 14 of the condenser 13 will produce 5.4 mA of current.

Figure 3:
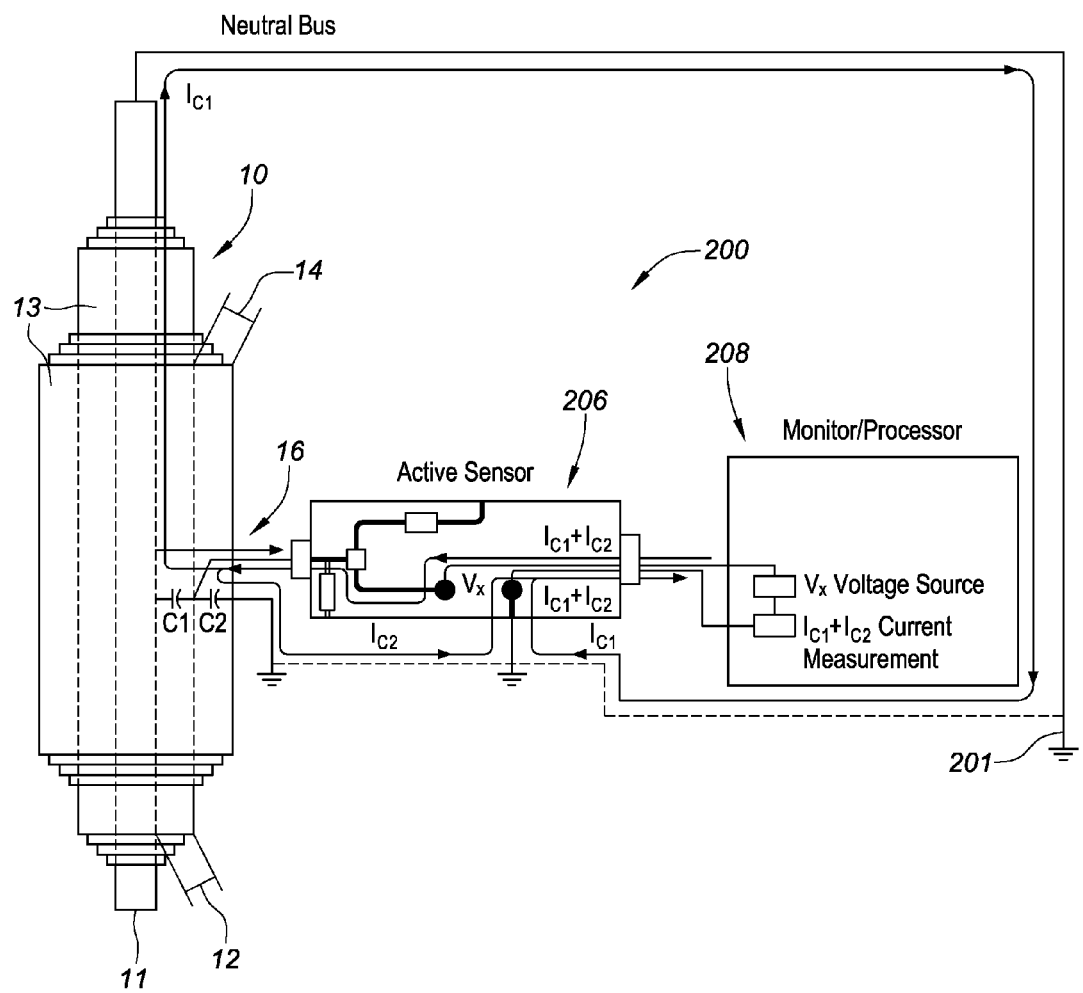
FIG. 3 illustrates one embodiment of a system for actively monitoring a neutral bushing.

FIG. 3 illustrates one embodiment of a system 200 for actively monitoring a neutral bushing 10. In the embodiment of FIG. 3, the system 200 also applies a high frequency voltage to the test tap 16. However, since the center conductor 11 of the neutral bushing 10 is connected to earth ground 201, either directly or through an impedance, the high frequency current input through test tap 16 passes through both the inner C1 section 12 and outer C2 section 14 of the bushing 10. Consequently, the measured current is an indication of C1+C2. In order to separate the measurements of the inner C1 section 12 and the outer C2 section 14, a high frequency voltage may be applied at a second frequency, such as 50 kHz, to permit separate capacitance and power factor values to be calculated for the inner C1 section 12 and the outer C2 section 14, provided the C1 and C2 capacitance values are not equal.

The C1 high frequency current $I_{C1}$ and the C2 high frequency current $I_{C2}$ are used to calculate the C1 and C2 bushing capacitance and power factor values. When monitoring a phase bushing, the two current values are used in combination with the reference voltage for C1. In addition to calculating the capacitance and power factor values for C1 and C2 sections of the bushing, partial discharge signals up to 1.5 GHz that may be produced in the transformer or reactor or in any of the bushings as a result of excess voltage stress may also be measured by the system utilizing the high frequency circuits of the sensor and testing device.

Figure 4:
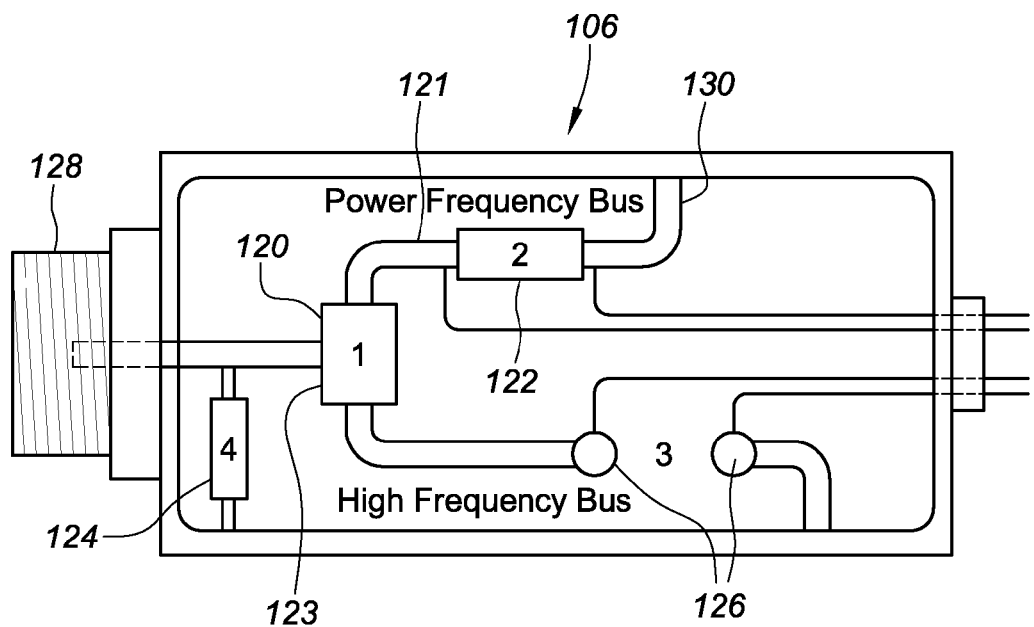
FIG. 4 illustrates one embodiment of an active sensor for use in a system to actively monitor a bushing, transformer or reactor.

FIG. 4 illustrates one embodiment of an active sensor for use in a system to actively monitor a bushing, transformer or reactor. As may be seen in the embodiment illustrated in FIG. 4, the active sensor 106 may comprise a power frequency bus 121 and a high frequency bus 123 separated by a high pass filter 120. In addition, the active sensor 106 may include one or more protective resistors 124, high frequency voltage input terminals 126 and a power frequency shunt 122.

As may be appreciated, the active sensor 106 is active as opposed to the passive sensors utilized on current systems. By active, it is meant that the sensor can input a voltage into the bushing. Accordingly, as may be seen in FIG. 4, high frequency voltage input terminals 126 are provided. Although in the embodiment shown in FIG. 4, the active sensor 106 only has input terminals 126 and the voltage source is outside the active sensor 106, in other embodiments, the voltage source may be located inside or as part of the active sensor 106.

The active sensor 106 includes a test tap connector 128. In preferred embodiments the active sensor 106 is attached to the test tap 16 using the same type of connector as prior systems. As may be seen in FIG. 4, a standard threaded connector may be used. However, in other embodiments, the active sensor 106 may be electrically coupled to the test tap 16 in other ways or in a custom way. Preferably the connection between the test tap 16 and active sensor 106 is made secure by the connector 128.

In preferred embodiments, a bandpass filter 120 separates the test tap currents into a power frequency path 121 and a high frequency path 123. In preferred embodiments, the bandpass filter 120 is a high pass filter. The power frequency circuit bus 121 contains a series shunt 122 and is then directly connected to the sensor body. Connecting the power frequency bus 121 to the sensor body solidly connects the power frequency section 121 of the test tap to earth ground. The series shunt 122 is a non-inductive resistance that is preferably in the 1-10 Ohm range. The series shunt 122 is designed to produce a voltage output across its ends that is representative of the test tap current magnitude and phase angle. Because the test tap is wired into the inner C1 section 12, this corresponds to the current magnitude and phase angle of the inner C1 section 12 of the bushing 10. As may be seen in FIG. 4, leads may be attached on either side of the series shunt 122 such that a monitor may have access to these values.

The design of the active sensor's power frequency bus 121 with a shunt 122 and direct connection 130 to the body of the sensor provides an inherently safe design that eliminates the risk of high voltages on the output circuit; unlike the designs of the current passive sensors, which can allow such high voltages on the output circuit. With the design shown in FIG. 4, the voltage measured across the shunt 122 will not rise above the normal 5-50 mV range if the circuit is opened.

On the opposite side of the high-pass filter 120, the active sensor 106 includes a high frequency bus 123. The high frequency bus 123 is open to provide two terminals 126 for application of the high frequency voltage.

Although in preferred embodiments, the active sensor 106 includes a bandpass filter, in other embodiments, measurement of the power frequency signal is not required. As may be seen from examining FIG. 3, when the system is monitoring a neutral bushing, the power frequency bus 121 of the active sensor 106 is not measured. Accordingly, solutions designed specifically to work with a neutral bushing may not include a measuring circuit for the power frequency signal. Instead, an active sensor 106 may be used that only includes a high frequency input measuring circuit and does not include measurement of the voltage across the shunt.

In comparing systems for use with neutral bushing versus systems with phase bushings, the main difference is that in systems with neutral bushings, the voltage across the shunt does not need to be measured since it should always be zero or nearly zero. In systems with neutral bushings, the bushing is grounded and the shunt would only have a voltage applied across it if the bushing was grounded through a grounding resistor or reactor and the system voltage became imbalanced, such as during a fault on the power system, which should only last for a very short time. Accordingly, sensors for both phase and neutral bushings may still include the high-pass filter, shunt and other components.

Returning to FIG. 2, in applications where the active sensor is connected to a phase bushing, the high frequency voltage is applied across the outer C2 section 14 of the bushing condenser 10. For phase bushings, the applied high frequency voltage produces a current $I_{C2}$ of the same frequency that passes: through the voltage terminals 126, test tap 16, outer C2 section 14 of the condenser 13, metal bushing flange and metal sensor body to the second voltage terminal. In preferred embodiments, the second voltage terminal is grounded to the sensor body. Alternately the second voltage terminal may be grounded to another point connected to the same grounded equipment, but the preferred connection is to connect the ground internally to the sensor body. This is shown by path 105 in FIG. 2.

Returning to FIG. 3, in applications where the active sensor 106 is connected to a neutral bushing, the high frequency voltage is applied across both the inner C1 section 12 and the outer C2 section 14. For neutral bushings, the applied high frequency voltage produces a current $I_{C1}+I_{C2}$ of the same frequency that passes through the voltage terminal 126 and test tap 16, then through both the C1 and C2 sections 12 and 14 of the condenser 13. The C2 current $I_{C2}$ then passes through the metal bushing flange and the C1 current $I_{C1}$ passing through the bushing conductor and ground bus and tank. Then both the C1 and C2 currents $I_{C1}+I_{C2}$ combine and pass through the metal sensor body to the second voltage terminal. FIG. 3 shows the C1 and C2 current paths.

Returning back to FIG. 4, regardless of the type of bushing the active sensor 106 is connected to, the protective resistor 124 provides a secondary high resistance connection between the test tap 16 and the grounded sensor body that will limit the voltage on the test tap 16 to a safe level. In preferred embodiments, the voltage on the test tap 16 is limited to about 100 V or less so that bushing damage does not occur in the event that the bandpass filter 120 fails. Preferably, the protective resistor 124 has a high resistance in the 100 kΩ range, which has no significant effect on the C1 or C2 measured currents $I_{C1}$ and $I_{C2}$. Although the embodiment of an active sensor 106 shown in FIG. 4 only includes one protective resistor 124, other embodiments may include more than one protective resistor 124.

Figure 5:
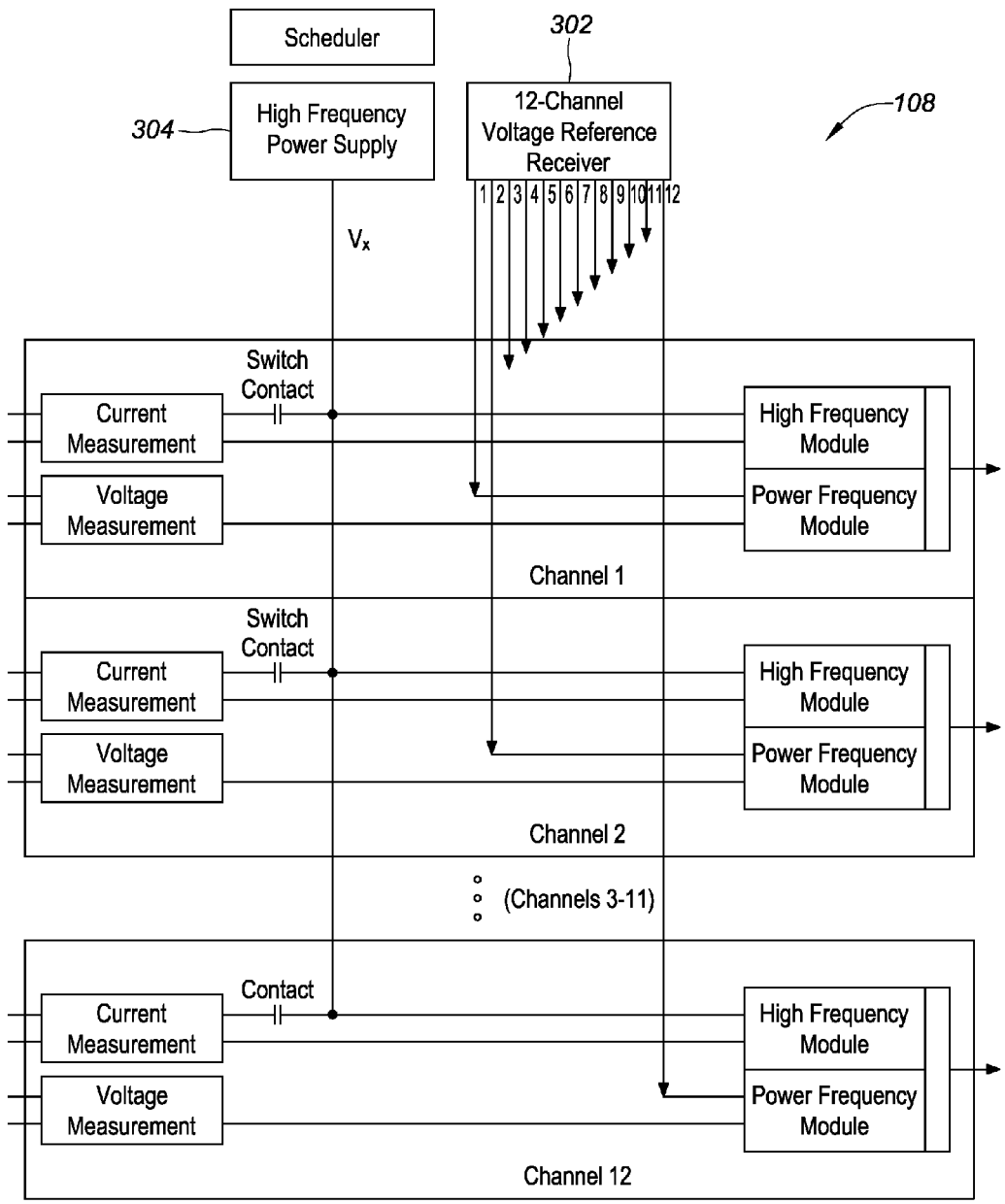
FIG. 5 illustrates one embodiment of the functional operation of a monitor/processor 108 for use with a system for actively monitoring a bushing.

FIG. 5 illustrates one embodiment of the functional operation of a monitor/processor 108 for use with a system for actively monitoring a bushing. FIG. 5 shows a 12 channel device including a high frequency power supply 304 and 12-channel voltage reference receiver 302. According, the monitor/processor 108 can receive inputs on 12 separate channels. Ideally, the monitor/processor 108 monitors all condenser type bushings on the equipment. In preferred embodiments, the monitor/processor 108 has 8 main functions.

In preferred embodiments, one function of the monitor/processor 108 is to receive a reference voltage and determine its magnitude and phase angle. In embodiments that include an electric field measuring device 102, the reference voltage signal may be supplied by the electric field measuring device 102. In other embodiments, the reference voltage signal may be received from voltage transformers or an alternate reference voltage source 104. Regardless of where the reference voltage is supplied from in the various different embodiments, the monitor/processor 108 preferably determines the reference voltage magnitude and phase angle.

In preferred embodiments, the reference voltage from the CCVT, potential transformer or other reference source should supply a sinusoidal voltage to the monitoring system. The sinusoidal voltage should represent a voltage magnitude that is proportional to the system high-voltage and a phase angle that is at a constant phase angle in relation to the system high voltage. This enables the monitoring system to compare the magnitude and phase angle of the measured reference voltage to the measured magnitude and phase angle of the voltage across the shunt and determine if there have been any changes from the initial relationships established when the system is first installed and commissioned.

In preferred embodiments, the monitor/processor 108 receives the power frequency voltage signal from the active sensor 106 and determines the magnitude and phase angle of the inner C1 section 12 test tap current $I_{C1}$.

Although the high frequency voltage source may be located anywhere in the system, it is preferably located within, or as part of, the monitor/processor 108 and the monitor/processor 108 supplies the high frequency voltage to the high voltage bus in the active sensor 106.

Another function of the monitor/processor 108 is to measure the high frequency bus current through the active sensor 106 and outer C2 section 14 of the bushing condenser 10, or through the C1 and C2 sections 12, 14 in the case of neutral bushings.

Yet another function of the monitor processor 108 is to measure partial discharge signals through the high frequency bus circuit in the sensor and analyze the data to determine bushing and/or transformer condition.

Another function of the monitor processor 108 is to calculate the bushing C1 and C2 capacitance and power factor values based on the data from the four functions listed above. Finally, in many embodiments the monitor/processor 108 may also issue alarms for abnormal conditions and communicate the bushing data to a network system.

In neutral bushings, a reference voltage is not used and the monitor/processor does not receive a separate current for the inner C1 section 12. Instead, for neutral bushings, the monitor/processor 108 applies the standard high frequency voltage and then a second frequency voltage (half-frequency, for example) to provide two measurements which can then be used to calculate the individual C1 and C2 capacitance and power factor values.

The monitor/processor 108 may be located on the top of the transformer, reactor or other equipment to minimize the cable lengths from the device to the bushings, or alternately, the monitor/processor 108 may be located at ground level near the equipment. In yet other embodiments the monitor/processor 108 may be located in other areas.

FIG. 5 shows the functional operation of the monitor/processor 108. The monitor/processor 108 may be equipped with a dual-frequency power supply 304 that supplies a voltage to the active sensor 106 for measuring the impedance of the outer C2 section 14 of the bushing condenser 13 in phase bushings and the C1 and C2 sections 12, 14 of the bushing condenser 13 in neutral bushings. The power supply voltage frequencies are in the 50 kHz and 100 kHz range and the voltage magnitude is in the 10 V range. Phase bushings can be tested with the higher frequency only, but neutral bushings need to be tested at both frequencies so the C1 and C2 capacitances and power factors can be calculated individually. The scheduler controls when each bushing is tested and cycles the tests on each channel so only one high frequency power supply is required. The scheduler also controls the high frequency inputs for neutral bushings, and applies test currents at two different frequencies for neutral bushings to enable calculation of the separate C1 and C2 capacitance and power factor values.

The embodiment of a monitor/processor 108 shown in FIG. 5 can receive up to 12 wireless signals from up to 12 electric field measuring and transmitting devices and High Frequency Current Transformer (HFCT) sets. Each device has a dedicated frequency to identify each signal by the bus voltage and phase. For phase bushings, the reference voltage signals 302 are used to provide the applied voltage magnitude and phase angle which is compared to magnitude and phase angle of the resulting C1 test tap current $I_{C1}$ to calculate the C1 capacitance and power factor.

In preferred embodiments, each channel of the monitor/processor 108 may be programmed or set for the type of bushing it will monitor. The monitor/processor 108 settings may be entered to assign the correct functions of each of the 12 channels, by entering whether the bushing is a phase bushing or a neutral bushing. In addition, each channel may have the baseline capacitance and power factor values of the bushing programmed in. Also, each channel may be programmed to distinguish whether the reference voltage signal is from an electric field measuring and transmitting device or is a direct cable connection to the device or if no reference voltage is available.

The setting of whether the bushing is a phase bushing or neutral bushing determines whether the high frequency voltage is applied with a single frequency or dual frequencies, and whether the test data is calculated to determine C2 capacitance and power factor only, or C1 and C2 capacitance and power factor. For phase bushings, the system may first measure and determine the C1 impedance value using the passive measurement of the voltage across the shunt compared to a reference voltage. Next, that C1 value may be used to calculate the C2 values from the measured currents. As an example for systems with just bushings, the C1 current and impedance can be measured, then the C1+C2 high frequency current and impedance can be measured. In order to determine the C2 current and impedance, the C1 impedance may be used to calculate the equivalent high frequency current, then the C1 current can be subtracted from the C1+C2 current to give the C2 value.

For neutral bushings, the injected high frequency current divides into three circuit paths. One passes through the C1 part of the condenser to the external ground termination (or ground resistor) and the other passes through the C2 part of the condenser to the earth ground. The third path goes into the transformer although this should be a very small portion of the total signal. The C1 portion of the injected current can be measured by an upper High Frequency Current Transformer (HFCT) or other device—the use of HFCT's will be explained in more detail below. The small portion of the injected high frequency current that passes into the transformer may be measured by a lower HFCT or other sensing device. The C2 portion may be calculated as the total injected current minus the current through the upper HFCT and the current through the lower HFCT.

The baseline capacitance and power factor values are the last tested values before the installation of the on-line testing device. These values are used as a comparison to determine appropriate alarm levels when deterioration is detected.

If a particular channel is set for receiving the reference voltage signal from one of the electrical field measuring and transmitting devices, the receiving module is activated and the channel utilizes the specific channel signal for the C1 capacitance and power factor calculation module for phase bushings. External reference voltages are not required for the C2 measurements or for neutral bushings since the voltage from the high frequency power supply serves as the reference. If the channel is set for receiving a wired circuit from a voltage transformer or other source as a reference voltage the channel utilizes the wired signal input for the C1 capacitance and power factor calculation module for phase bushings. If the channel is set for no reference voltage, the system utilizes the C1 input voltages, the voltage measured across the shunt, to the other channels as a relative reference. However, using the C1 input voltages to the other channels as a relative reference is not preferred because it is less accurate.

The monitor/processor 108 calculates C1 and C2 capacitance values for each utilized channel and issues this data by conventional analog and digital transmission systems to local and remote monitoring networks. The monitor/processor 108 may also issue alarms based on the set alarm levels for each channel to local and remote monitoring networks or systems. The monitor/processor 108 may also detect loss of signal to detect any circuit or signal problems and to identify when the bushings are out of service. In some embodiments, the monitor/processor 108 may also measure the high frequency partial discharge signals from the bushing sensor and utilizes algorithms to determine the severity and causes of the discharges.

In preferred embodiments, all data is output through established communications protocols, as required.

Figure 6:
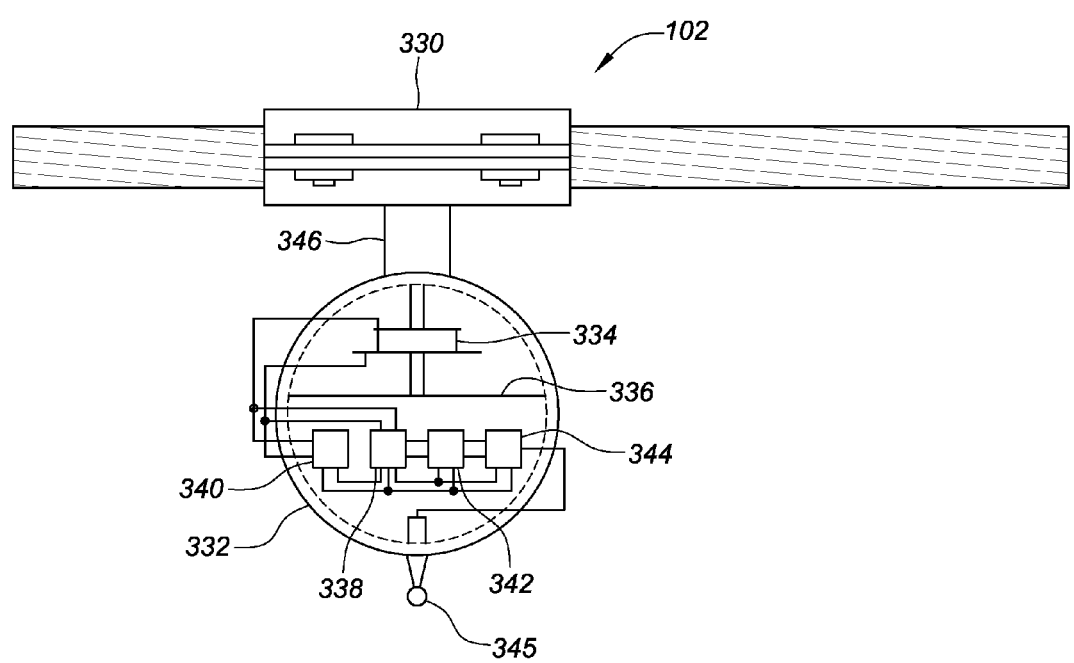
FIG. 6 illustrates a functional cutaway view of one embodiment of an electric field measuring and transmitting device.

In embodiments that monitor phase bushings, a reference voltage is preferably used. In some of those embodiments, the reference voltage is supplied by an electric field measuring and transmitting device (EFMTD) 102. FIG. 6 illustrates a functional cutaway view of one embodiment of an electric field measuring and transmitting device (EFMTD) 102. FIG. 6 illustrates the basic construction, components and circuitry of an EFMTD. Internal circuit wiring and connections are shown inside and outside the device for functional clarity and are not intended to necessarily show the physical location of any wiring.

In preferred embodiments, the EFMTD 102 is attached to the energized conductor or bus near the top of the bushing. Attachment of the EFMTD may be accomplished in a variety of ways but is preferably accomplished with a bolted cable or pipe clamp type fitting. Ideally the EFMTD should hang below the energized conductor or bus and above the equipment tank at earth potential, within the electric field produced by the nearby high voltage conductor or bus.

In the embodiment of an EFMTD shown in FIG. 6, the EFMTD consists of an attachment clamp or fitting 330; a spherical, cylindrical or other shaped body 332 made of dielectric material; a capacitive collector 334; internal shield 336; rectifier 340; voltage regulator 338; amplifier 342; transmitter 344; and antenna 345. In other embodiments, other components may be included or removed.

In operation, the capacitive field detector/collector 334 is utilized to sense and measure the alternating current power frequency field in the region near and directly below the conductor or bus and to collect power from the field for the amplifier and transmitter. The magnitudes of the changes in the alternating current electric field are directly proportional to the magnitudes of the changes in the voltage on the high voltage conductor or bus.

In preferred embodiments, the dimensions of the capacitive field detector/collector are adjusted for the voltage of the cable or bus. The gap between the upper and lower capacitive plates should be sized to provide a steady-state alternating current voltage magnitude that will be within the operating range of the voltage regulator after rectification.

The phase angle of the transmitted sinusoidal signal should be accurate to not less than 0.01 degrees to provide a reference signal that can be used to calculate power factor values with not more than 0.01% accuracy error.

Each electrical field measuring and transmitting device 102 used in a substation or plant must have a separate transmission frequency within an approved frequency band so the individual bus voltages for each bushing can be transmitted and received and utilized as a reference for calculation of C1 capacitance and power factor for each monitored bushing. The low power transmitter only needs to provide a reliable transmission range on the order of 25 meters to transmit the signals from the electrical field measuring and transmitting device at the top of the equipment to receiver in the testing device on the equipment cover or location adjacent to the equipment. Each transformer, reactor, circuit breaker or related equipment can be equipped with as many as 12 electrical field measuring and transmitting devices.

The electrical field measuring and transmitting device 102 may also be used with a receiver and signal output device to provide sinusoidal voltage signals with magnitude and phase angle signals representing the sinusoidal voltage on the high voltage conductor for protective relays, metering devices, synchronizing relays and other related equipment that requires bus voltage inputs. The output device can be scaled to provide the required power or load burden.

In other embodiments, a system is provided to not only monitor the health of the bushing and the bushing condenser C1 and C2 windings, but to also monitor the transformer, reactor or other device the bushing is attached to. Embodiments that monitor the device the bushing is attached to use a similar active sensor attached to the test tap and similarly inject a high frequency voltage into the bushing via the active sensor's connection to the test tap. However, in these embodiments, one or more High Frequency Current Transformer (HFCT) measurement and transmitting devices are used. In preferred embodiments, two HFCT's are connected to each bushing, one on the power grid side (usually the top) and one on the transformer side (usually the bottom). As used herein when referring to the bushing, "top", "bottom", "power grid side", and "transformer side", are used purely for purposes of orientation. If the "transformer side" is referenced, it does not mean the bushing must be attached to a transformer only that we are referring to that side of the bushing. The same applies for the terms "top", "bottom" and "power grid side." The HFCTs measure the high frequency injected current that passes out of the power grid side of the bushing into the power grid and out of the transformer side of the bushing into the transformer.

Figure 7:
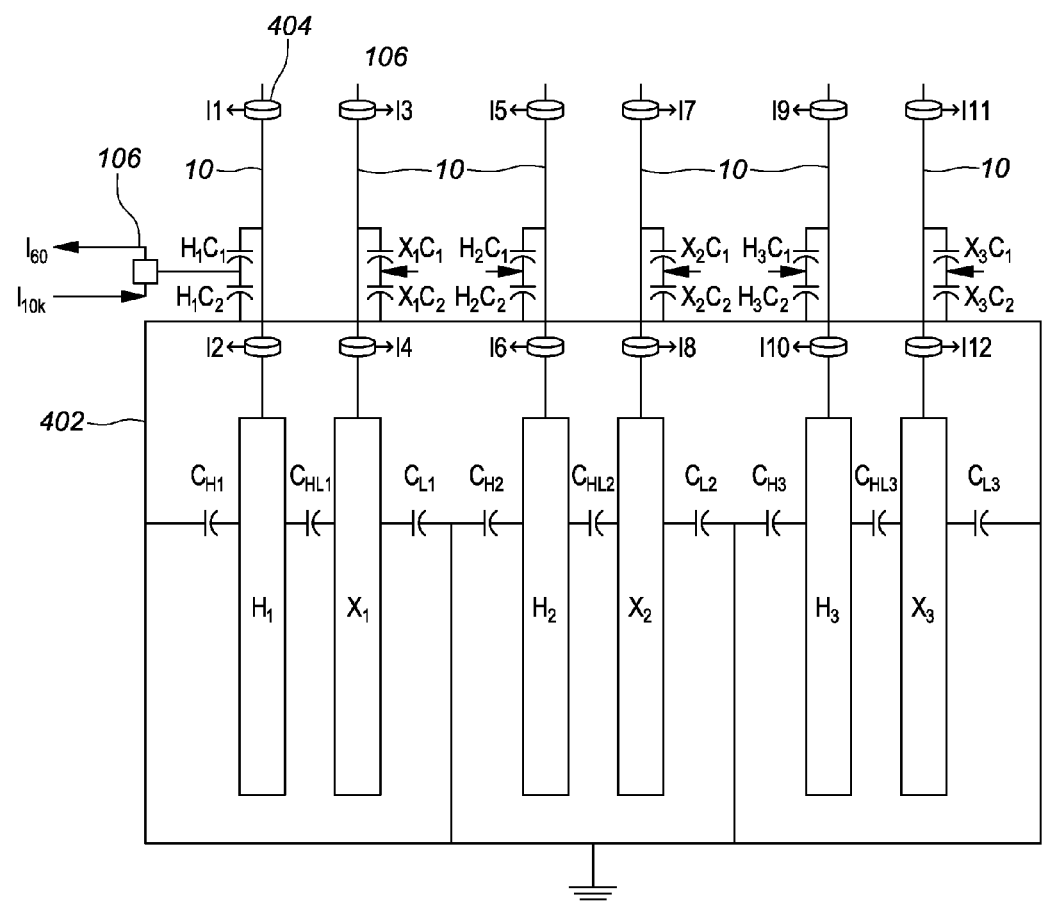
FIG. 7 illustrates a 3-phase, two winding transformer with six condenser type bushings wired for use in an active monitoring system.

FIG. 7 illustrates a 3-phase, two winding transformer 402 with six condenser type bushings 10 wired for use in an active monitoring system. As may be seen in FIG. 7, each bushing 10 includes an HFCT on the power grid side 404 and transformer side 406. While in preferred embodiments every bushing 10 in the transformer 402 is connected to the monitoring system and has corresponding HFCTs, in other embodiments only a subset of the transformer bushings are wired for monitoring. As may be seen on the first bushing 10, an active sensor 106 is attached to the test tap of the bushing 10. Although not shown, preferably each bushing also has a separate active sensor 106 attached to its test tap. Also not shown is the monitor/processor 108 that would receive the signals as part of the system. These signals may be hardwired or sent wirelessly to the monitor/processor 108.

In the embodiments utilizing HFCTs, the monitoring system utilizes a circuit model for each phase of each type of transformer. The purpose of the system is to monitor each insulation component or insulation system for any break down in insulation that could cause discharge/failure. The system sequentially measures the capacitance and power factor values of each different insulation component and/or insulation systems, referred to herein as "capacitances." In preferred embodiments, the system uses measured and calculated values in a model to develop a complete model with values for each capacitance. The monitoring system compares the circuit model component values over time to detect changes in the values due to deterioration. In preferred embodiments, the monitoring system issues telemetry containing the capacitance, power factor and current values for each model component as well as alarms when deterioration in any component is detected. The models and calculations for capacitance and power factor values are established formulae and mathematics that are well known to people in the electrical engineering field.

Insulation systems measured at higher frequencies will normally exhibit a frequency-dependent response which will affect calculated capacitances or power factors. For this reason, the measured capacitances and power factors obtained from high frequency injection must be either reported as high frequency values or converted to 60 Hz equivalent values.

Figures 8A, 8B:
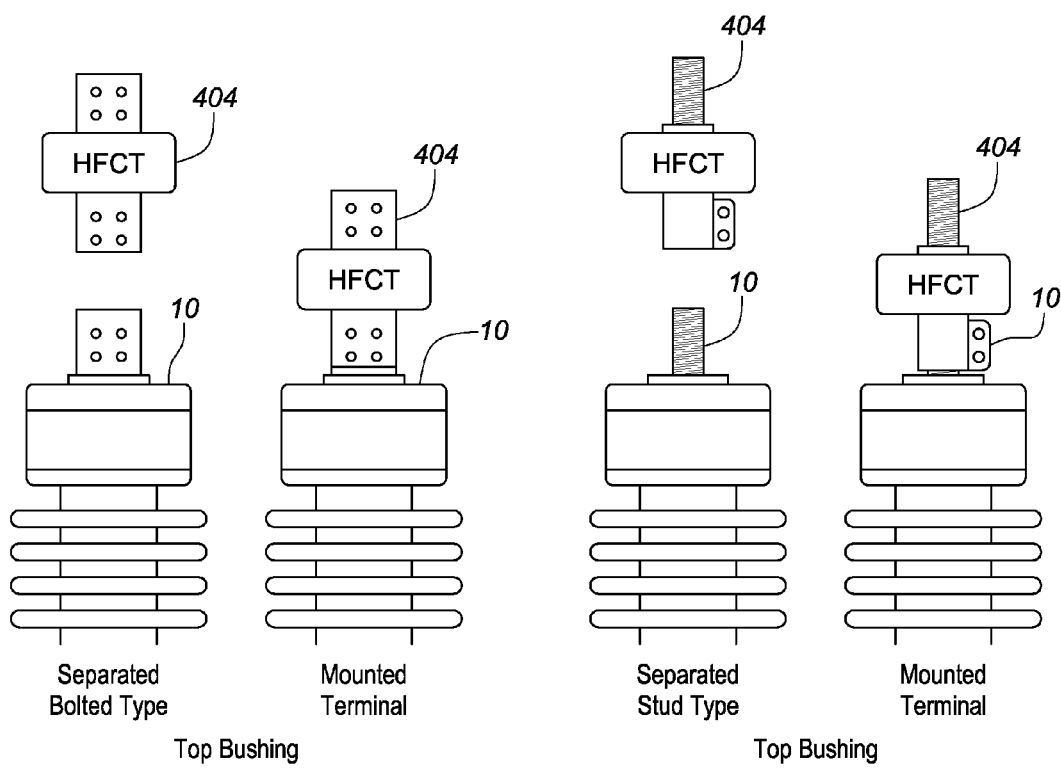
FIG. 8A illustrates a HFCT separated and coupled to a bolted type top terminal of a bushing.
FIG. 8B illustrates a HFCT separated and coupled to a stud type top terminal of a bushing.

In some embodiments, the lower HFCT 406 is a new complete bushing HFCT. In other embodiments, the lower HFCT 406 may be connected to the secondary output of existing bushing CT's. FIG. 8A illustrates a HFCT 404 separated and coupled to a bolted type top terminal of a bushing 10. FIG. 8B illustrates a HFCT 404 separated and coupled to a stud type top terminal of a bushing 10. As may be seen in FIGS. 8A and 8B the HFCTs may be easily added into the system on both the power grid side and transformer side of the bushing and may mount directly to the interface of the inner conductor of the bushing.

In some embodiments, the upper HFCT 404 mounts on the power grid side of each bushing 10 and wirelessly transmits the signal to a receiver component of the monitor/processor 108 (not shown). In other embodiments, the signals from the HFCT 404 may be hard wired to the monitor/processor 108. The signal may be received by the monitor/processor 108 and used as a reference for accurate calculation of bushing C1 power factor and capacitance values. In other embodiments, the upper HFCT 404 may be connected to the secondary output of existing bus current transformers, if available.

In setting up a system to work with a transformer, the frequency of the injected signal voltage/current can be adjusted and set over a range of 1 kHz to 100 kHz. Preferably, the value is selected to lower the impedances of the transformer and bushing model capacitances to a range where the power supply loads are low and the frequency is well outside the range for partial discharges. Additionally, the voltage magnitude can be adjusted and set at low levels that can be trusted to not exceed any electrical stress insulation values in the bushings or windings. The frequency may need to be shifted to avoid any resonant frequencies which can be determined with Frequency Response Analysis testing during commissioning of the transformer and/or active monitoring system.

The measured capacitances and power factor values obtained with injected high frequency signals will not normally be consistent with the same data obtained with power frequency testing. This is primarily due to the frequency dependent impedance of the type of insulation systems used in bushings and transformers. The frequency dependence of the solid and liquid insulation systems will also affect the bushing and winding capacitance values. During commissioning, the monitoring system may be programmed with off-line test data. In addition, the monitoring system may calculate correction factors to adjust all of the calculated capacitances and power factors to equivalent power frequency values for comparison to traditional off-line and factory test values. As the use of this type of system becomes more common, users may choose to have factory tests performed at high frequencies and may elect to view the high frequency data rather than corrected values.

In preferred embodiments, basic models for each type of bushing and transformer or reactor are programmed into the system and selected during commissioning. Once the transformer is energized and the monitoring system is in-service, the system sequentially performs tests to determine each of the model component values. One embodiment of a sequential process for monitoring a transformer and corresponding bushing and comparing those values to the model values is discussed below. However, alternate sequences may be developed to similarly determine the model component values.

Figure 9:
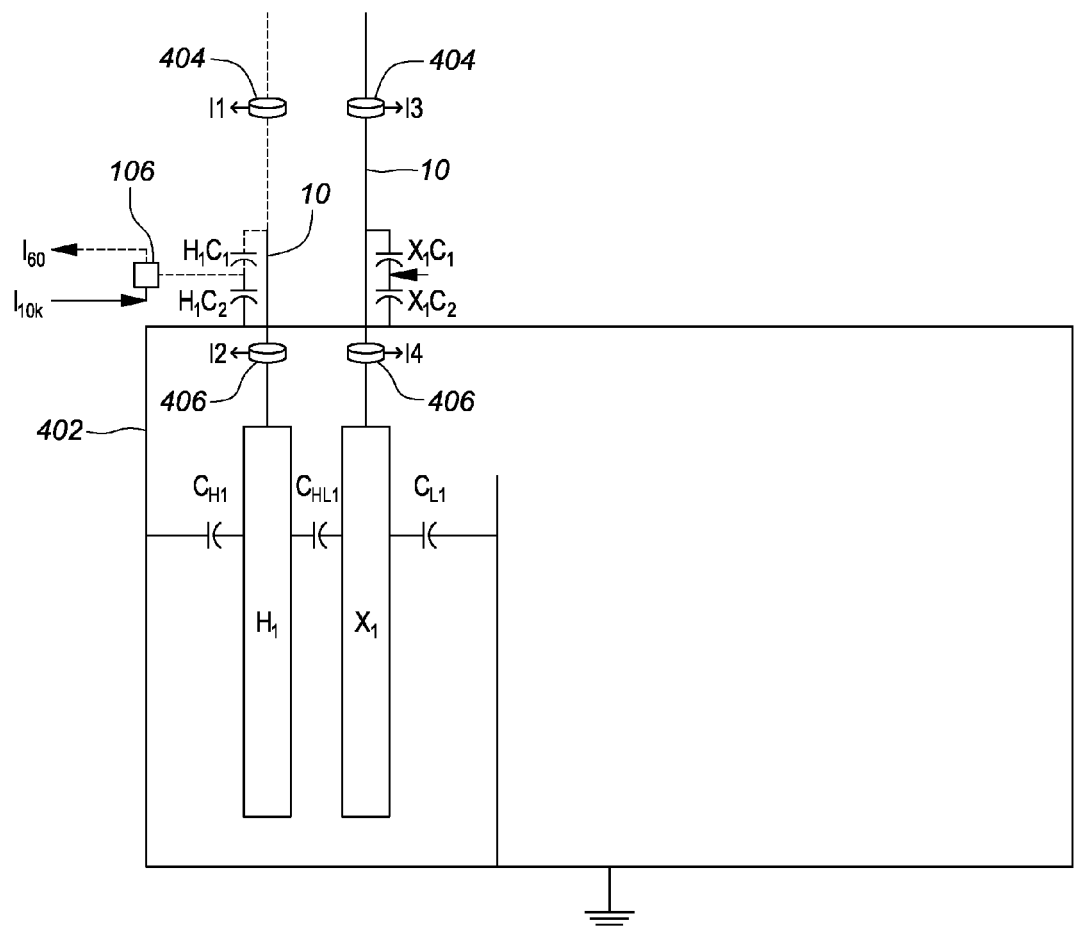
FIG. 9 illustrates a single phase transformer model highlighting the signal path for the high voltage bushing C1 signal as a dotted line.

In order to monitor the bushing, the power frequency current magnitude and phase angle needs to be measured. As previously discussed with other embodiments, this may be measured from the test tap of the HV bushing. FIG. 9 illustrates a single phase transformer model highlighting the signal path for the HV bushing C1 signal as a dotted line.

Figure 10:
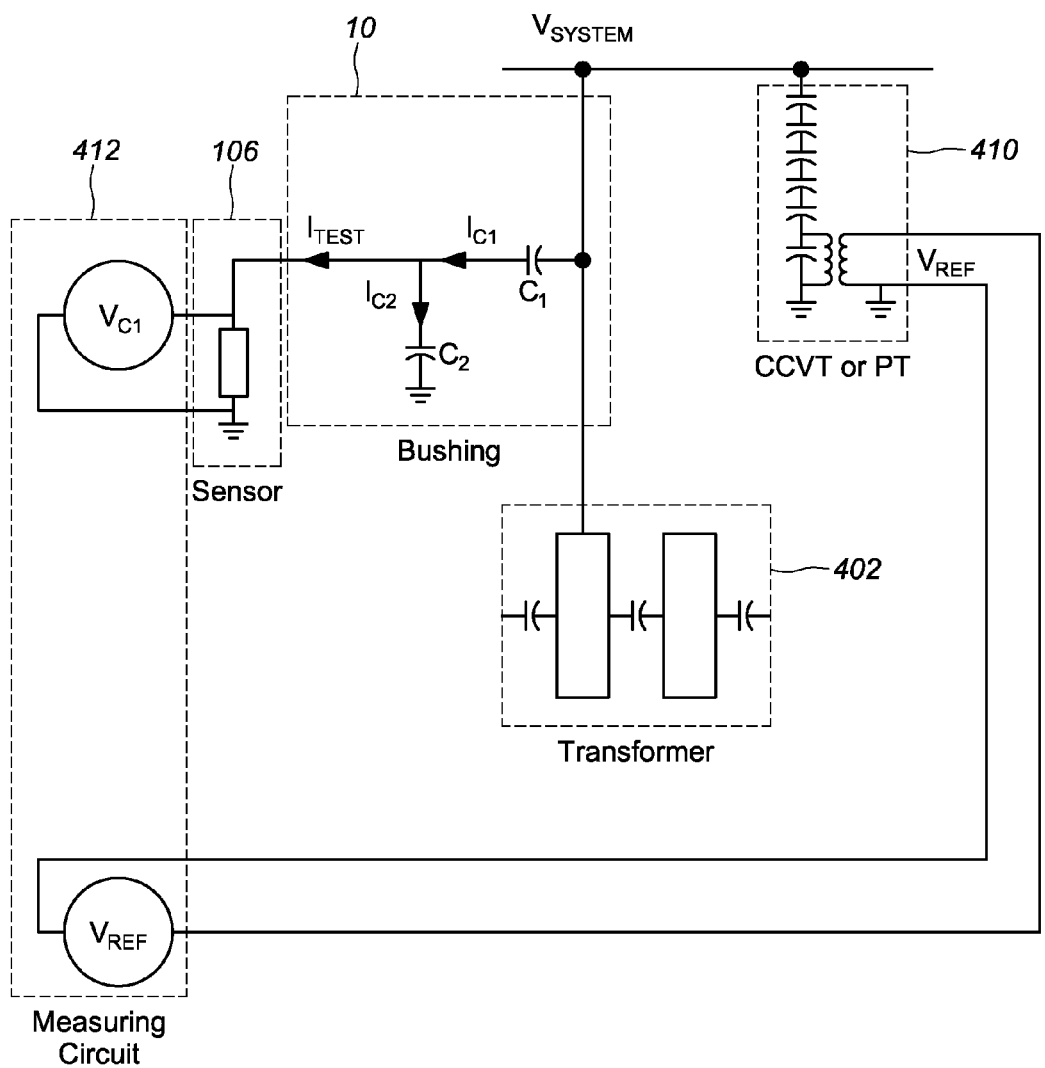
FIG. 10 illustrates a measurement circuit for bushing C1 capacitance and power factor using a Capacitive Coupled Voltage Transformer or Potential Transformer as a reference.

In some embodiments, a Capacitive Coupled Voltage Transformer (CCVT) or a Potential Transformer (PT) may be used to provide a reference voltage to the system. FIG. 10 illustrates a measurement circuit 412 for measuring bushing 10 C1 capacitance and power factor using a CCVT or PT 410 as a reference. In embodiments using a CCVT or PT 410, the power frequency voltage magnitude and phase angle for the HV bus, $V_{REF}$, may be measured from the output of the CCVT or the PT 410. Once the measurements have been made, algorithms may be used to compare the voltage and current magnitudes of $V_{REF}$ (shown in FIG. 10) to I60 (shown in FIG. 9) to determine the bushing C1 capacitance and to compare the voltage and current phase angles to determine the bushing C1 power factor.

Figure 11:
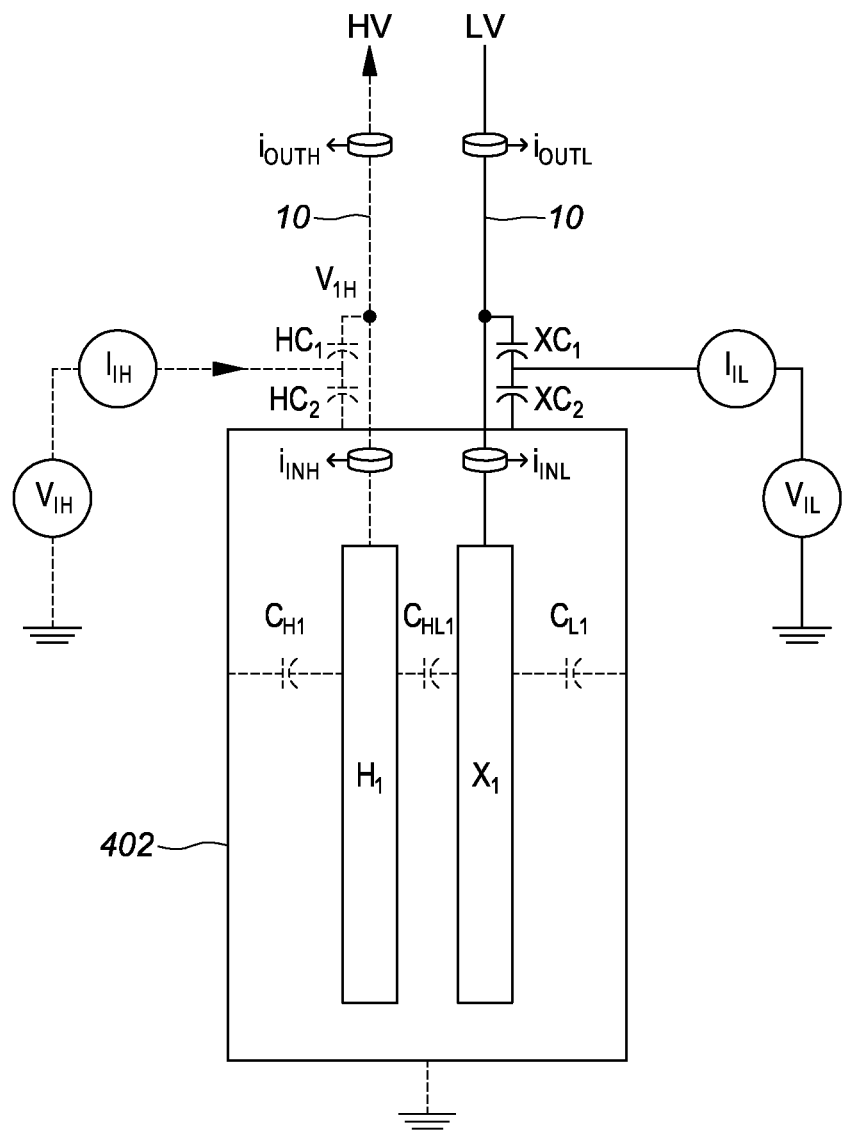
FIG. 11 illustrates a single phase transformer model showing the injected signal path for measurement of the HV bushing C2 and transformer CH, CHL and CL.

As explained above, the properties of the outer C2 section of the bushing condenser may not be ascertained without injecting a signal into the bushing. FIG. 11 illustrates a single phase transformer model showing the injected signal path for measurement of the HV bushing C2 and transformer CH, CHL and CL. To this end, a high frequency signal, referenced to ground, may be injected into the HV bushing test tap through the active sensor. Once the signal has been injected, the applied voltage $V_{IH}$ and resulting total current $I_{IH}$ may be measured. The current magnitude and phase angle through the C2 portion of the bushing condenser may be calculated as: $I_{C2}=I_{IH}-(I_{OUTH}+I_{INH})$. The C2 capacitance and power factor may be calculated from the relative magnitudes and phase angles of $V_{IH}$ and $I_{C2}$. The high frequency voltage at the bushing center conductor, $V_{IH}$ may be calculated from $V_{IH}$ minus the voltage drop of $I_{C1}$ through C1. The total impedance of CH in parallel with CHL+CL can be calculated from $V_{IH}$ and $I_{INH}$.

Figure 12:
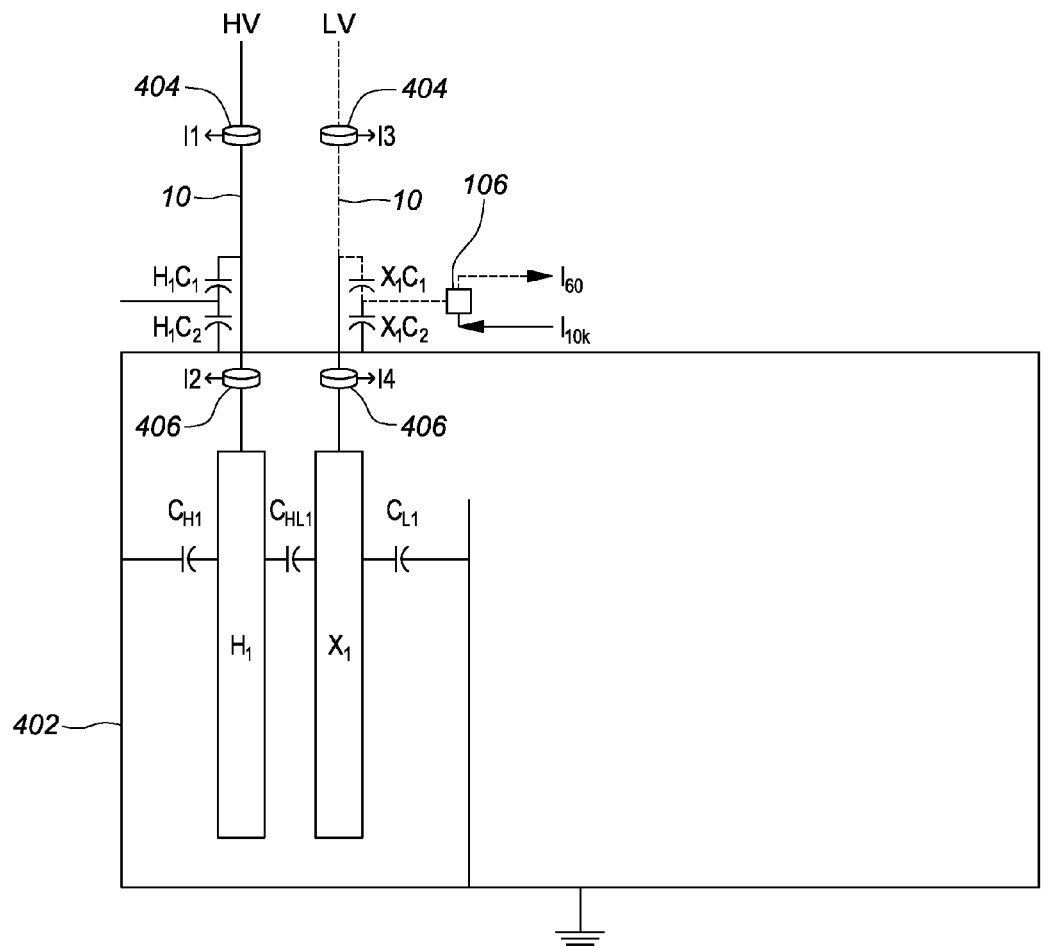
FIG. 12 illustrates a single phase transformer model showing the signal path for the XV bushing C1 signal.

Next, the power frequency current magnitude and phase angle from the test tap of the secondary winding (also referred to as XV or LV bushing) should be measured. FIG. 12 illustrates a single phase transformer model showing the signal path for the XV bushing C1 signal. Similar to the HV bushing, the power frequency voltage magnitude and phase angle for the XV bus, $V_{REF}$, may be measured from the output of a CCVT or PT as shown in FIG. 11. Once again, algorithms may be used to compare the voltage and current magnitudes of $V_{REF}$ (shown in FIG. 10) to I60 (shown in FIG. 12) to determine the XV bushing C1 capacitance and to compare the voltage and current phase angles to determine the XV bushing C1 power factor.

Figure 13:
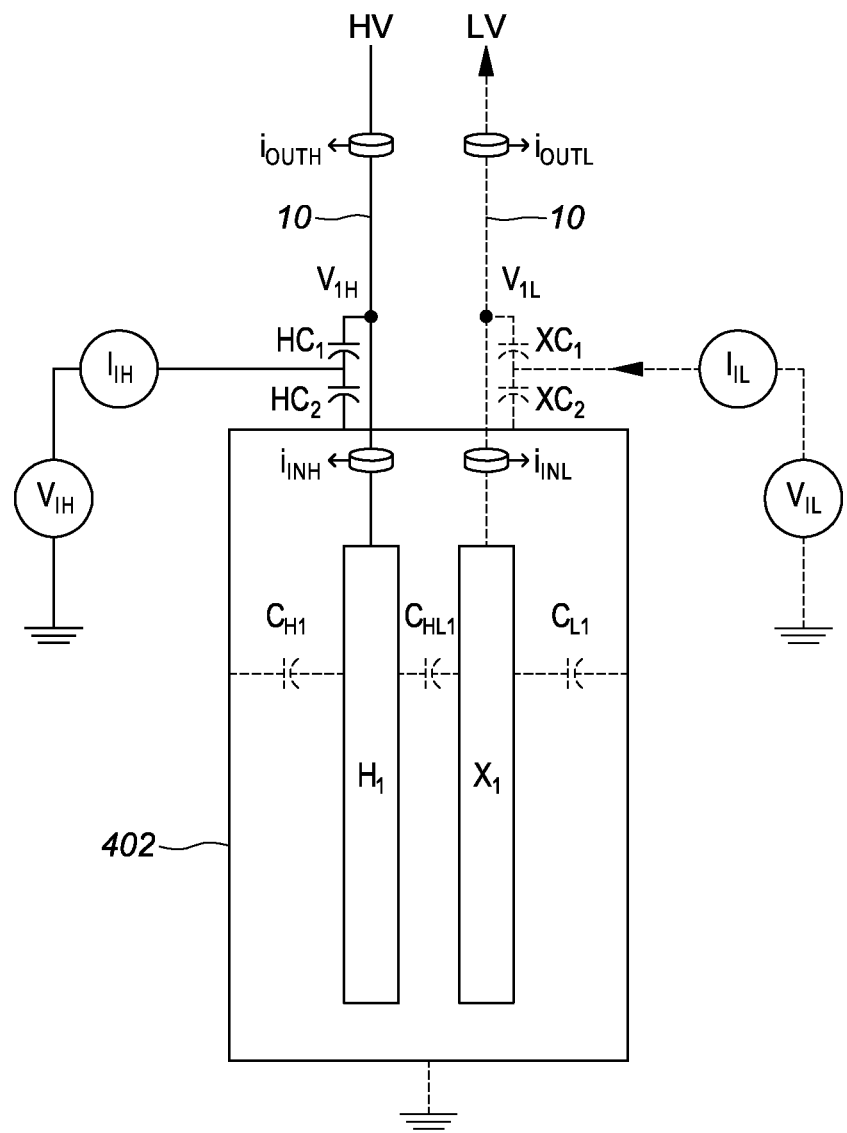
FIG. 13 illustrates a single phase transformer model showing the injected signal path for measurement of the XV bushing C2 and transformer CH, CHL and CL.

Also similar to the HV bushing, in order to monitor the properties of the outer C2 section of the XV bushing, a signal must be injected. FIG. 13 illustrates a single phase transformer model showing the injected signal path for measurement of the XV bushing C2 and transformer CH, CHL and CL. A high frequency signal, referenced to ground, is injected into the XV bushing test tap through the active sensor. The applied voltage $V_{IL}$, and resulting total current $I_{IL}$ are measured. The current magnitude and phase angle through the C2 portion of the bushing condenser may be calculated as: $I_{C2}=I_{IL}-(I_{OUTL}+I_{INL})$. The C2 capacitance and power factor may be calculated from the relative magnitudes and phase angles of $V_{IL}$ and $I_{C2}$. The high frequency voltage at the bushing center conductor, $V_{IL}$ may be calculated from $V_{IL}$ minus the voltage drop of $I_{C1}$ through C1. The total impedance of CL in parallel with CHL+CH may be calculated from $V_{IL}$ and $I_{INL}$.

Figure 14:
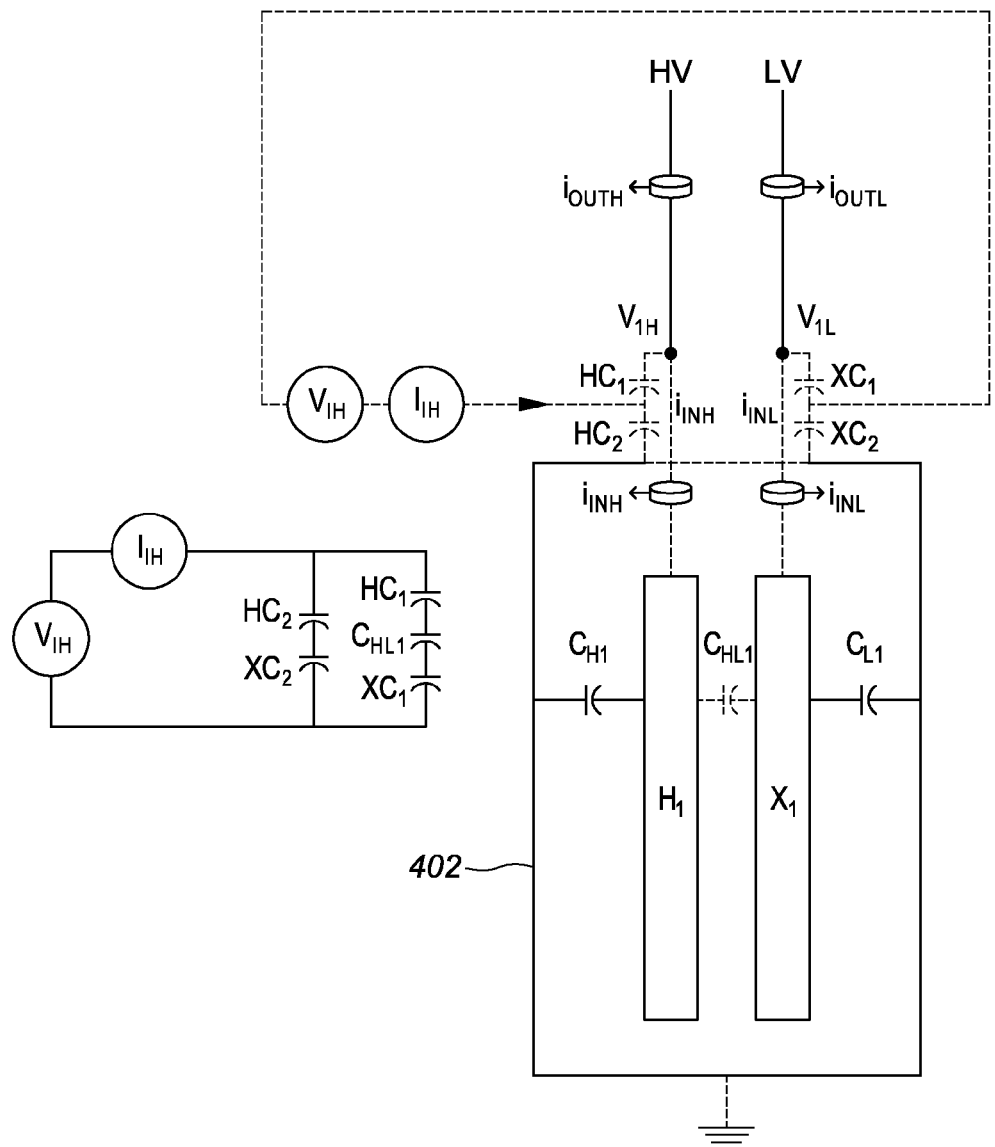
FIG. 14 illustrates a single phase transformer model showing the injected path for measuring the CHL of the transformer 402.

In order to calculate the CHL of the transformer, an ungrounded high frequency signal may be injected into the HV bushing test tap and out of the XV bushing test tap. FIG. 14 illustrates a single phase transformer model showing the injected path for measuring the CHL of the transformer 402. Using the known HV and XV bushing capacitances and power factors and the circuit model, the CHL capacitance and power factor values may be calculated.

Once the CHL of the transformer is known, the CH and CL capacitances may then be calculated with the model using the calculated CHL values and the total impedances for CH, CHL and CL measured from the HV and XV bushings.

The steps above and the figures they reference cover a single-phase transformer. For three-phase transformers, the sequence above is repeated 3 times, first for A-phase, second for B-phase and finally for C-phase. If the transformer has one or more windings connected in a wye configuration with a neutral bushing, the following additional step is included for each neutral bushing.

Figure 15:
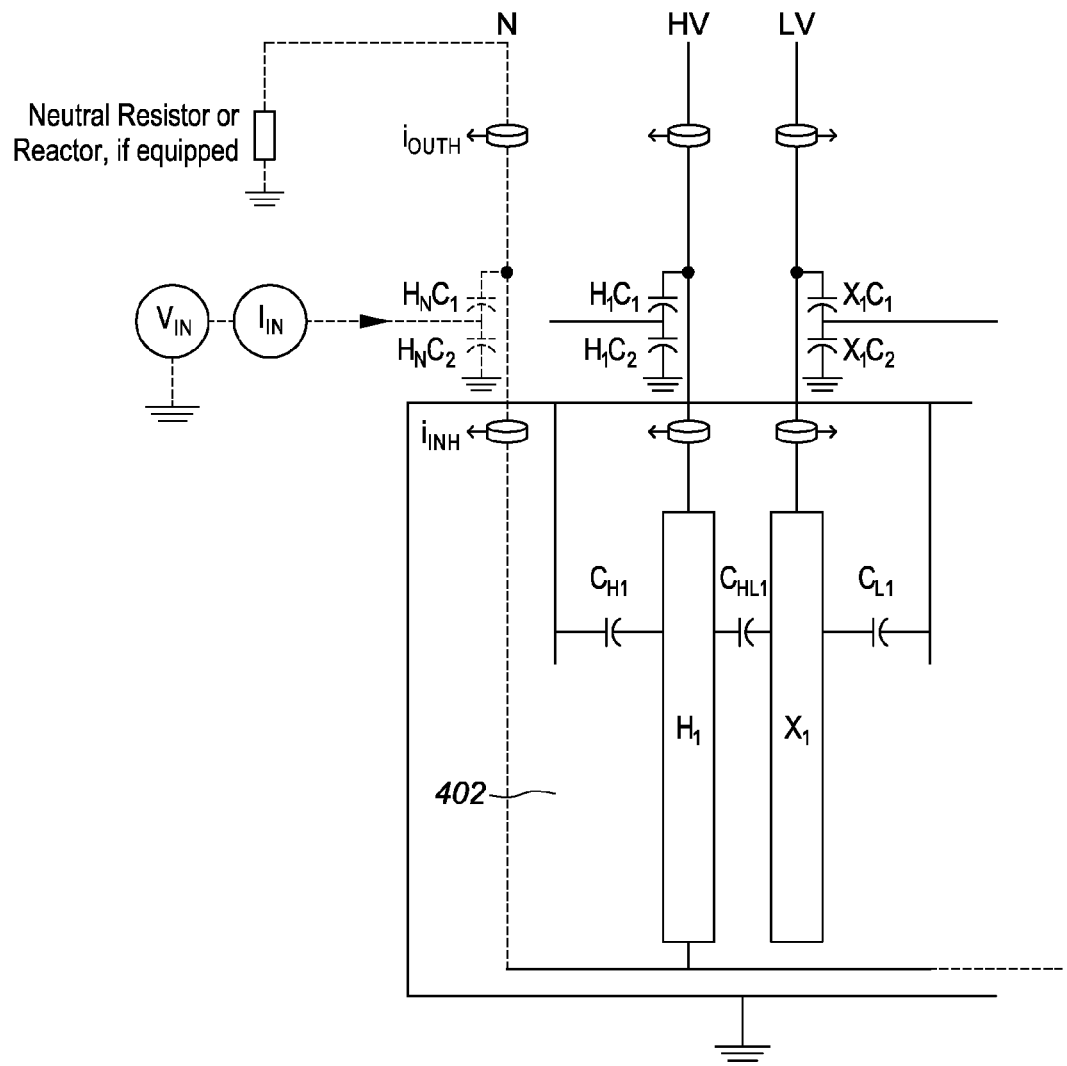
FIG. 15 illustrates a single phase transformer model showing the signal path for measurement of a neutral bushing C1 and C2 properties.

A high frequency signal, referenced to ground, is injected into the neutral bushing test tap through the active sensor. FIG. 15 illustrates a single phase transformer model showing the signal path for measurement of a neutral bushing C1 and C2 properties. The total injected current $I_{IN}$, is the sum of the current through the bushing C1 and C2 condenser section capacitances. The current through the C1 condenser section is the sum of $i_{OUTN}+i_{INN}$. The applied voltage, $V_{IN}$, is applied across the C2 condenser section and across the C1 condenser section in series with any neutral ground impedance (such as a grounding resistor or reactor), if equipped.

Figure 16:
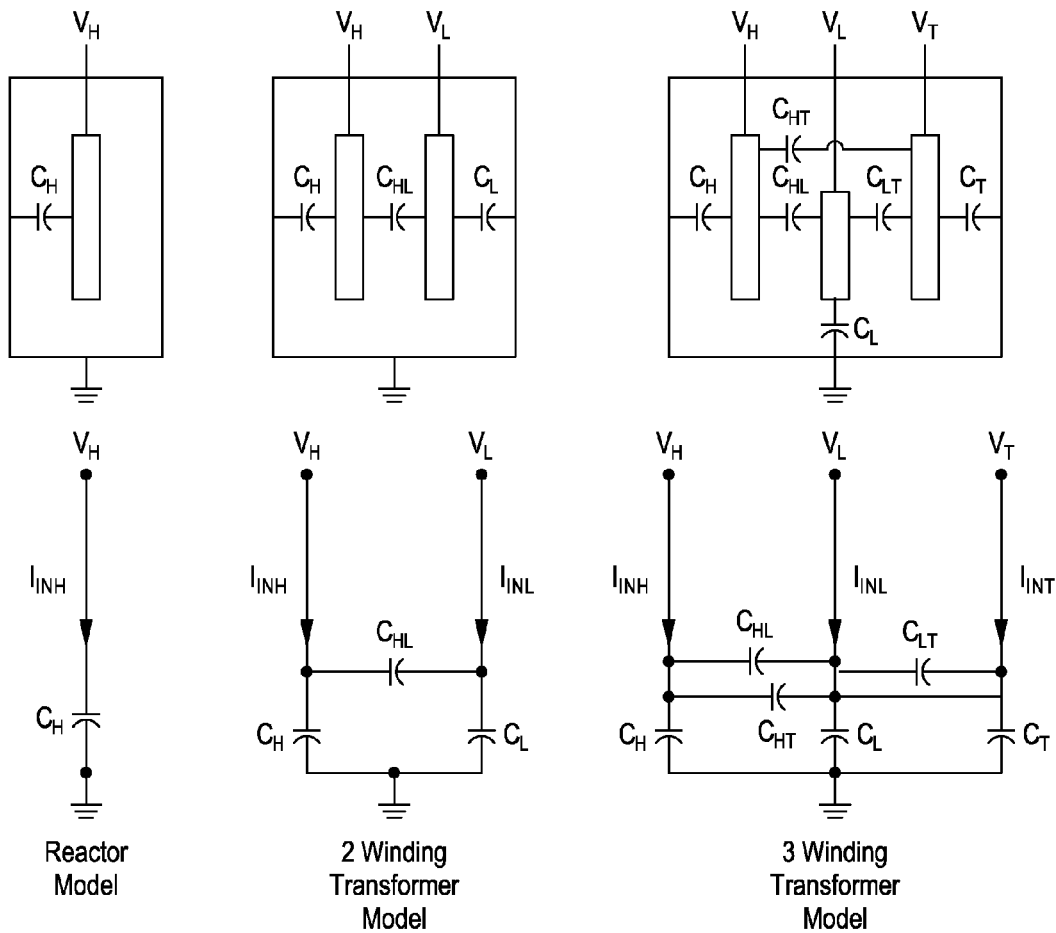
FIG. 16 illustrates models of a reactor, a two winding transformer and a three winding transformer showing the capacitance from each winding to ground and to each other winding.

FIG. 16 illustrates models of a reactor, a two winding transformer and a three winding transformer showing the capacitance from each winding to ground and to each other winding. As may be seen in FIG. 16, a reactor may be equated to a single winding transformer. A three winding transformer has additional winding and inter-winding capacitances. The 3 winding model components may be determined using a similar, although more complex, process as the two winding model using the following general steps: 1.) Calculate all C1 bushing capacitances; 2.) Inject high frequency current, referenced to ground, into each bushing sequentially to calculate each bushing's C2 capacitance and the total impedance of the winding capacitances from each bushing; 3.) Inject high frequency current, referenced to ground, into each neutral bushing to calculate the C1 and C2 capacitances and power factors; 4.) Inject ungrounded high frequency current from the HV to XV bushing, from the XV to TV bushing, and from the HV to TV bushing for each phase to calculate CHL, CLT and CHT; and 5.) Use the model to calculate the CH, CL and CT capacitances and power factors.

Similar to other embodiments described herein, embodiments incorporating HFCTs also include a monitor/processor 108. The elements below may be located within a single monitor/processor 108 or may be located in other areas within the system. Preferably, the monitoring and test system is modular and may be expanded or reduced to accommodate transformers or reactors with different winding configurations and different numbers of bushings.

The system is equipped with sine wave signal generator of sufficient power to inject current into the transformer under each configuration. The system is equipped with a controller to switch the signal electronically and route the current through each module to perform the required tests, as required. Preferably, each module contains a voltage measurement device to measure the power frequency voltage magnitude and phase angle across the bushing sensor shunt. Each module may also contain voltage and current measurement devices to measure the magnitude and phase angle of the injected high frequency signals. Each module may also be equipped with 2 input terminals for the reference voltage input and a voltage measurement device to measure the reference voltage magnitude and phase angle. Each module may also be equipped with two sets of HFCT inputs, one for the upper HFCT and one for the lower HFCT. Ideally, the system is equipped with one module for each bushing, although there is no requirement that every bushing be monitored or monitored with a separate module.

If the upper HFCT's for any set of bushings are attached to the bushings and transmitting the high frequency current magnitude and phase angle data wirelessly, the monitoring system is preferably equipped with a receiver with not less than the number of channels required for each wireless HFCT. If the upper HFCT's for any set of bushings are auxiliary high frequency current transformers connected to existing bus current transformers, then the high frequency current magnitude and phase angle data can be transmitted to the monitoring system by a physical circuit of wire or fiber optic cable.

Figure 17:
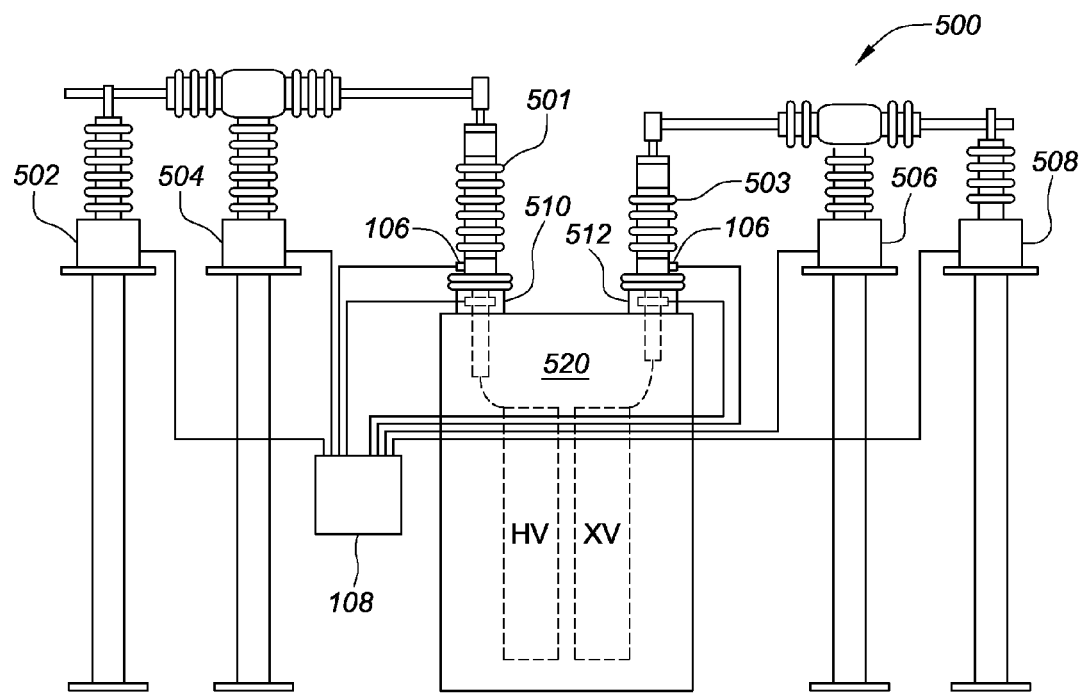
FIG. 17 illustrates a schematic of one embodiment using existing substation current and voltage transformers connecting to the monitor with wiring; and, FIG. 18 illustrates a schematic of one embodiment of a system 600 using field sensors and HFCT's.

FIG. 17 illustrates a schematic of one embodiment 500 using existing substation current and voltage transformers 502, 504, 510, 512, 506 and 508, connecting to the monitor with wiring 108. The system 500 shown in FIG. 17 includes HV voltage transformer 502, HV current transformer 504, HV bushing 501, HV bushing active sensor 106 connected to the bushing 501 test tap, HV bushing current transformer 510, XV voltage transformer 508, XV current transformer 506, XV bushing 503, XV bushing active sensor 106 connected to the bushing 503 test tap, XV bushing current transformer 512, transformer 520 and monitor/processor 108. The system 500 of FIG. 17, works similar to other systems explained above. However, as may be seen in FIG. 17, in some systems incorporating bushings, the system will already include existing current and voltage transformers 502, 504, 510, 512, 506 and 508 as part of the system. To this end, additional HFCTs or other additional transformers may not be needed and the existing current and voltage transformers can be wired directly to the monitor 108.

Figure 18:
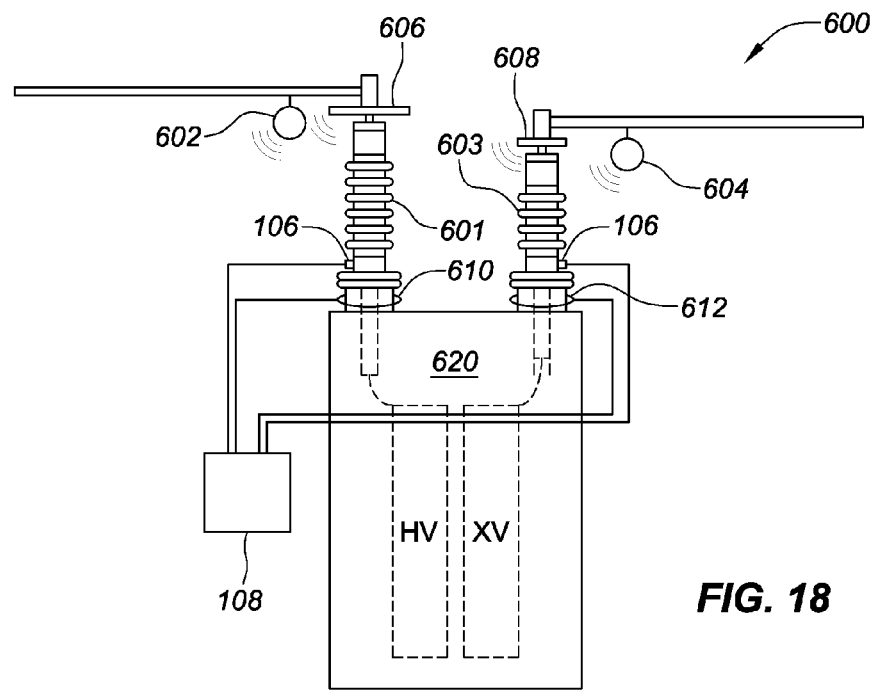

FIG. 18 illustrates a schematic of one embodiment of a system 600 using field sensors and HFCT's. FIG. 18 includes HV voltage field measuring and transmitting device 602, HV grid end HFCT 606, HV bushing 601, HV bushing active sensor 106 coupled to the test tap of the HV bushing 601, HV transformer end HFCT 610, XV voltage field measuring and transmitting device 604, XV grid end HFCT 608, XV bushing 603, XV bushing active sensor 106 coupled to the test tap of the XV bushing 603, XV transformer end HFCT 612, transformer 620 and monitor/processor 108. The system 600 shown in FIG. 18 works similar to the embodiments above. However, the system has both HFCT's and voltage field measuring and transmitting devices 602 and 604.

In operation, the voltage field measuring and transmitting devices wirelessly provide the system voltage magnitude and phase angle measurements that are used by the system in the same manner as the reference voltage magnitude and phase angles to determine C1 bushing condenser values when wired connections are used. The HFCT's provide the system with magnitude and phase angle measurements of the injected high-frequency signals passing through the bushing and into the power system or into the transformer in the same manner as when measured from existing external high voltage current transformers on the power system bus or bushing current transformers.

In preferred embodiments, the system utilizes non-volatile memory and a central processing unit to store the settings, the transformer models and the calculated data. In some embodiments, the system is equipped with a communications system that may output data with various established communications protocols, as required.

The system may evaluate the baseline test values and recommend a high frequency test frequency, which can be accepted or adjusted during setup. When the system detects deterioration in any component, an alarm message may be issued and the test cycle frequency may be reduced. For example, if the test cycle is set at twice a day, the test cycle may be reduced to hourly.

In various different embodiments, many different settings may be entered. In a preferred embodiment, the following settings are entered during commissioning: 1.) Transformer type (Transformer, Autotransformer); 2.) Transformer configuration (Single-phase, Three-phase); 3.) Transformer windings (Reactor, Two-winding, Three-winding); Baseline test values (C1 capacitance and power factor for each bushing, C2 capacitance and power factor for each bushing, Capacitance and power factor for each winding to ground and between each winding); 4.) Default test cycle frequency (Continuous, 15 minutes, 30 minutes, hourly, 3 hours, 6 hours, 12 hours, daily, weekly, 30 days).

Although the embodiments have been described with reference to preferred configurations and specific examples, it will readily be appreciated by those skilled in the art that many modifications and adaptations of the bushing, transformer and/or reactor monitoring system are possible without departure from the spirit and scope of the embodiments as claimed hereinafter. Thus, it is to be clearly understood that this description is made only by way of example and not as a limitation on the scope of the embodiments as claimed below.

What is claimed is:

1. A system for monitoring insulation components in an energized power system including a bushing comprising:
   an active sensor coupled to a test tap of the bushing, the active sensor comprising an electrical circuit electrically coupled to the test tap, wherein the electrical circuit includes a high pass filter that divides the electrical circuit into a high frequency bus and a power frequency bus, the power frequency bus including a shunt;
   a high frequency voltage source in electrical communication with the high frequency bus and the test tap via the high pass filter; and
   a monitor electrically connected to the active sensor to allow a voltage measurement across the shunt and a current measurement on the high frequency bus;
   wherein the system is configured to monitor the insulation components while the energized power system is in an energized state.

2. The system of claim 1 further comprising a first high frequency current transformer coupled to a power grid side of the bushing and a second high frequency current transformer coupled to a transformer side of the bushing.

3. The system of claim 1 wherein the power frequency bus is electrically coupled to a body of the active sensor.

4. The system of claim 3, wherein the electrical circuit of the active sensor further comprises a resistor electrically connecting the test tap to the sensor body.

5. The system of claim 4, wherein the resistor has a resistance around 100 kΩ.

6. The system of claim 1, further comprising an electric field measuring device in electrical communication with a center conductor on a power grid side of the bushing.

7. The system of claim 1, further comprising a reference voltage source in electrical communication with the monitor.

8. The system of claim 7, wherein the reference voltage source is a capacitance coupled voltage transformer or a potential transformer in electrical communication with the top of the bushing.

9. The system of claim 1, wherein the high frequency voltage source is designed to supply a voltage at two separate frequencies about 50 kHz apart.

10. A method for monitoring insulation components in an energized system comprising:
    attaching an active sensor to a bushing test tap, the active sensor including an electrical circuit that has a high pass filter that separates the circuit into a power bus circuit and a frequency bus circuit;
    injecting a high frequency voltage into the test tap via the frequency bus circuit;
    measuring a current magnitude and a phase angle of a high frequency current produced in the sensor body by the high frequency voltage; and,
    determining a capacitance and power factor for an outer condenser section of the bushing from the measured current magnitude and phase angle;
    wherein the attaching, injecting, measuring, and determining steps are performed while the energized system is in an energized state.

11. The method of claim 10 further comprising:
    measuring a voltage across a shunt in the power bus circuit;
    determining a first current magnitude and a first phase angle from the voltage across the shunt; and,
    determining a capacitance and power factor for an inner condenser section of the bushing from the measured first current magnitude and first phase angle.

12. The method of claim 10, further comprising measuring a voltage magnitude and phase angle from a reference voltage source and comparing the measured voltage magnitude and phase angle with the first current magnitude and first phase angle to determine the capacitance and power factor for the inner condenser section of the busing.

13. The method of claim 12, wherein the reference voltage source is supplied by an electrical field measuring and transmitting device in electrical communication with a center conductor on a power grid side of the bushing.

14. The method of claim 12, wherein the reference voltage source is hard wired from a transformer.

15. The method of claim 10, further comprising receiving a reference current magnitude and phase angle from a high frequency current transformer in electrical communication with a center conductor of a power grid side of the bushing and using the reference current magnitude and phase angle to determine the capacitance and power factor of the inner condenser section of the bushing.

16. The method of claim 10, wherein the injected high frequency voltage has a frequency between about 1 kHz and 100 kHz.

17. The method of claim 12, wherein the reference voltage source is supplied by a capacitive coupled voltage transformer in electrical communication with a center conductor of a power grid side of the bushing.

18. The method of claim 12, wherein the reference voltage source is supplied by a Potential Transformer in electrical communication with a center conductor of a power grid side of the bushing.

19. The method of claim 10, wherein the high frequency voltage is unground and further comprising measuring the voltage at a second test tap of a second bushing that is the result of the injected ungrounded high frequency voltage passing through a transformer or reactor and further comprising calculating the $C_{HL}$ of the transformer or reactor.

20. The method of claim 10, further comprising calculating the $C_{HL}$ capacitances and power factor values.

21. A system for monitoring insulation components in a power system including a bushing comprising:
    a 1 kHz or more voltage source in electrical communication with a test tap of the bushing; and,
    a sensor electrically coupled to the power system to measure a current magnitude and a phase angle of a high frequency current produced by the 1 kHz or more voltage passing through an outer section of the bushing.

22. The system of claim 21, wherein the bushing is a phase bushing.

23. The system of claim 21, wherein the bushing is a neutral bushing.

24. The system of claim 21, further comprising an active sensor coupled to the test tap, the active sensor comprising an electrical circuit electrically coupled to the test tap, wherein the electrical circuit includes a high pass filter that divides the electrical circuit into a high frequency bus and a power frequency bus.

25. The system of claim 21, wherein the frequency of the voltage source is 20 kHz or more.

26. The system of claim 21, wherein the frequency of the voltage source is 50 kHz or more.

27. A method for monitoring insulation components in an energized system including a bushing comprising:
   injecting a 1 kHz or more high frequency voltage into a test tap of the bushing;
   measuring a current magnitude and a phase angle of a high frequency current produced in an outer condenser section of the bushing by the high frequency voltage; and,
   determining a capacitance and power factor of the outer condenser section of the bushing from the measured current magnitude and phase angle;
   wherein the injecting, measuring, and determining steps are performed while the energized system is in an energized state.

28. The method of claim 27, wherein the bushing is a phase bushing.

29. The method of claim 27, wherein the bushing is a neutral bushing.

30. The method of claim 27, further comprising attaching an active sensor to the bushing test tap, the active sensor including an electrical circuit that has a high pass filter that separates the circuit into a power bus circuit and a frequency bus circuit.

31. The method of claim 27, wherein the frequency of the voltage source is 20 kHz or more.

32. The method of claim 27, wherein the frequency of the voltage source is 50 kHz or more.

* * * * *